United States Patent
Holman, Jr.

(10) Patent No.: US 8,952,686 B2
(45) Date of Patent: Feb. 10, 2015

(54) HIGH CURRENT RANGE MAGNETORESISTIVE-BASED CURRENT SENSOR

(75) Inventor: Perry A. Holman, Jr., Garland, TX (US)

(73) Assignee: Honeywell International Inc., Morristown, NJ (US)

( * ) Notice: Subject to any disclaimer, the term of this patent is extended or adjusted under 35 U.S.C. 154(b) by 245 days.

(21) Appl. No.: 13/281,019

(22) Filed: Oct. 25, 2011

(65) Prior Publication Data

US 2013/0099779 A1   Apr. 25, 2013

(51) Int. Cl.
| | | |
|---|---|---|
| G01N 27/72 | (2006.01) | |
| G01R 33/12 | (2006.01) | |
| G01R 15/20 | (2006.01) | |
| G01R 15/18 | (2006.01) | |
| G01R 33/07 | (2006.01) | |
| G01R 33/09 | (2006.01) | |
| G01R 33/02 | (2006.01) | |
| G01R 33/00 | (2006.01) | |

(52) U.S. Cl.
CPC ............ G01R 15/205 (2013.01); G01R 15/181 (2013.01); G01R 15/185 (2013.01); G01R 33/07 (2013.01); G01R 33/09 (2013.01); G01R 33/12 (2013.01)
USPC ........................ 324/228; 324/252; 324/207.11

(58) Field of Classification Search
CPC .. G01R 15/205; G01R 15/181; G01R 15/185; G01R 33/07; G01R 33/09; G01R 33/12
USPC ...... 324/252, 207.1, 228, 249, 117 R, 117 H; 338/32 R
See application file for complete search history.

(56) References Cited

U.S. PATENT DOCUMENTS

| | | | | |
|---|---|---|---|---|
| 4,361,805 A | * | 11/1982 | Narimatsu et al. ........ | 324/207.21 |
| 6,566,856 B2 | * | 5/2003 | Sandquist et al. ......... | 324/117 R |
| 6,667,682 B2 | * | 12/2003 | Wan et al. .................. | 338/32 R |
| 6,781,359 B2 | * | 8/2004 | Stauth et al. .............. | 324/117 H |
| 6,882,145 B2 | * | 4/2005 | Ehresmann et al. .......... | 324/252 |
| 7,504,927 B2 | * | 3/2009 | Shoji ........................... | 338/32 R |
| 7,583,073 B2 | | 9/2009 | Kumar et al. | |

(Continued)

OTHER PUBLICATIONS

Yang et al., "A Residual Current Measurement Method With a combination of MR and Hall Effect Sensors," IEEE, 2010, 4 pages.

(Continued)

*Primary Examiner* — Vinh Nguyen
*Assistant Examiner* — Raul Rios Russo
(74) *Attorney, Agent, or Firm* — Craige Thompson; Thompson Patent Law Offices

(57) ABSTRACT

A system includes a magnetoresistive (MR) bridge circuit, a magnetic field sensor, and an adjustable load. The MR bridge circuit receives a supply voltage and generates an output voltage that indicates a strength/direction of a magnetic field. The MR bridge circuit includes first and second MR elements connected in series between a supply node and a ground node, and third and fourth MR elements connected in series between the supply node and the ground node. The output voltage is generated between a first node that is common to the first and second MR elements and a second node that is common to the third and fourth MR elements. The sensor generates signals based on the strength/direction of the magnetic field. The adjustable load is connected in parallel with one of the MR elements, and has a resistance that is controlled based on the signals generated by the sensor.

20 Claims, 12 Drawing Sheets

(56) References Cited

U.S. PATENT DOCUMENTS

| | | | |
|---|---|---|---|
| 7,612,553 B2 | 11/2009 | Kinzel | |
| 7,768,083 B2 | 8/2010 | Doogue et al. | |
| 7,859,255 B2* | 12/2010 | Doogue et al. | 324/207.25 |
| 2008/0012558 A1 | 1/2008 | Rossler et al. | |
| 2011/0227637 A1* | 9/2011 | Stuber et al. | 327/546 |
| 2012/0032674 A1* | 2/2012 | Rajula et al. | 324/253 |

OTHER PUBLICATIONS

Dickinson et al., "Isolated Open Loop current Sensing Using Hall Effect Technology in an Optimized Magnetic Circuit," Jul. 11, 2002, 12 pages.

Product Brochure, "Sensor Signal Conditioning IC for Closed-Loop Magnetic Current Sensor," DRV401, SBVS070B—Jun. 2006—Revised May 2009, 36 pages.

Product Brochure, "CSN Series, CSNS300, Closed Loop Current Sensor," downloaded on Jun. 10, 2011, 3 pages.

Product Brochure, "Installation Instructions for CSN Series Closed Loop Linear Current Sensors," PK XP-4062, Issue 1, 2004, 2 pages.

Product Brochure, "Magnetic Current Sensing," Magnetic Products, downloadable from http://www.ssec.honeywell.com , downloaded on Jun. 10, 2011, 7 pages.

Product Brochure, "Magnetic Sensor Products," HMC/HMR Series, downloadable from http://www.ssec.honeywell.com, 1996, 4 pages.

Product Brochure, "Applications of Magnetic Position Sensors," AN211, downloadable from http://www.ssec.honeywell.com, downloaded on Jun. 10, 2011, 8 pages.

Product Brochure, "1-and 2-Axis Magnetic Sensors," HMC1001/1002, HMC1021/1022, downloadable from http://www.ssec.honeywell.com, downloaded on Jun. 10, 2011, 15 pages.

\* cited by examiner

HIGH CURRENT RANGE MAGNETORESISTIVE-BASED CURRENT SENSOR

TECHNICAL FIELD

The disclosure relates to current sensing systems, and, more particularly, to closed loop current sensing systems.

BACKGROUND

Electrical current sensing systems may measure current (AC or DC) through a current carrying wire by measuring the magnetic field associated with the current carrying wire. For example, current sensing systems may determine the direction and magnitude of the current through the wire based on the magnitude and direction of the magnetic field associated with the wire. In some current sensing systems, the current carrying wire may be placed adjacent to a ferromagnetic core that defines a gap region in which the magnetic field generated around the wire is concentrated. The concentration of the magnetic field in such a gap region may provide a location at which the magnetic field generated by the current carrying wire may be reliably measured.

A variety of different current sensing systems may use a ferromagnetic core that defines a gap region, as described above. Current sensing systems using such an arrangement of a current carrying wire and ferromagnetic core may be described as open loop sensing systems or as closed loop sensing systems. In an open loop sensing system, the current through the current carrying wire may be determined by measuring the magnetic field in the gap region. In such an open loop system, a magnetic field sensor is located in the gap region and the wire is located adjacent to the core such that the current through the wire generates a magnetic field that is concentrated in the gap region. A circuit of the open loop sensing system may measure signals generated by the magnetic field sensor and determine the current in the current carrying wire based on the signals generated by the magnetic field sensor.

A closed loop sensing system may be used instead of the open loop sensing system described above. A closed loop sensing system may include the wire, core, and magnetic field sensor in the gap region of the core, as described above with respect to the open loop sensing system. Additionally, the closed loop sensing system may also include a secondary coil that may be wrapped around the core. This secondary coil may receive current from a control circuit and generate a magnetic field in the gap region in addition to the magnetic field generated by current through the current carrying wire. The control circuit of the closed loop system may receive signals from the magnetic field sensor in the gap region and generate a current in the secondary coil that attempts to zero out the magnetic field in the gap region. The amount of current required to zero out the magnetic field in the gap region may indicate the magnitude and direction of the magnetic field in the gap region. The magnitude and direction of current through the current carrying wire may be determined based on this current generated by the control circuit, e.g., determined based on the number of turns in the secondary winding relative to the number of turns in the current carrying wire.

SUMMARY

Closed loop current sensing systems may use magnetoresistive (MR) bridge circuits (e.g., anisotropic MR bridge circuits) to measure the strength and direction of magnetic fields in the gap region of a ferromagnetic core. MR bridge circuits may include a plurality of MR elements, each of which has a resistance that is dependent on the magnetic field in the gap region. The MR bridge circuit, which may be configured in a Wheatstone bridge configuration, may output a voltage that indicates the strength and direction of the magnetic field in which the MR bridge circuit is located.

An MR bridge circuit may accurately indicate the strength and direction of magnetic fields when the magnetic fields are less than a threshold magnitude, e.g., less than approximately 25 Oersteds (Oe) in some examples. Accordingly, a control circuit in a closed loop sensing system may accurately and reliably control current delivered to the secondary coil based on the output voltage of an MR bridge circuit when the magnetic fields present in the gap region are less than or equal to the threshold magnitude.

However, at larger magnetic fields, e.g., greater than the threshold magnitude, various behaviors may arise in the MR bridge circuit that decrease the desirability of the MR bridge circuit for use in closed loop sensing applications. In one example, the MR elements included in the MR bridge circuit may each tend to "saturate" to the same resistive value in the presence of larger magnetic fields. This saturation effect may cause the output voltage of the MR bridge circuit in the Wheatstone configuration to drop towards zero volts, which may also be the same output voltage of the MR bridge circuit when the magnetic field in the gap region is approximately at 0 Oe. This ambiguity in what the output voltage of the MR bridge circuit may represent may cause the control circuit of the closed loop sensing system to inaccurately control current through the secondary coil. Inaccurate control of current through the secondary coil may lead to inaccurate sensing of the magnetic field in the gap region, especially in scenarios where the magnetic field in the gap region (i.e., current in the current carrying wire) undergoes large and/or rapid fluctuations. In other words, the control circuit of the closed loop sensing system may not accurately and reliably control for large and/or rapid changes in the magnetic field in the gap region, and therefore, the measurements of current through the current carrying wire may be subject to errors in such a scenario.

A closed loop current sensing system according to the present disclosure includes a modification circuit that modifies operation of the MR bridge circuit to cause the MR bridge circuit to produce a reliable and predictable output voltage, even when the MR bridge circuit is subjected to large and/or rapid fluctuations in magnetic field strength. This reliable and predictable output voltage of the MR bridge circuit, when provided to the control circuit, may allow the control circuit to reliably and accurately maintain the magnetic field in the gap region at approximately zero field strength, and therefore allow for accurate measurement of the current through the current carrying wire, even when large and/or rapid current fluctuations are present in the current carrying wire.

The modification circuit of the present disclosure may include a second magnetic field sensor located in the gap region along with the MR bridge circuit. In some examples, the second magnetic field sensor may include a hall sensor since a hall sensor may provide more accurate and reliable readings of the magnetic field in the gap region for magnetic fields that may tend to saturate the MR bridge circuit. Additionally, the modification circuit may include first and second adjustable loads that are each connected to the MR bridge circuit. The first and second adjustable loads may have resistive values that are controlled based on the signals generated by the second magnetic field sensor.

The modification circuit of the present disclosure may be configured to modify operation of the MR bridge circuit to prevent the output voltage of the MR bridge circuit from transitioning towards zero volts for magnetic fields having magnitudes that are greater than the threshold magnitude. For example, the modification circuit may cause the output voltage of the MR bridge circuit to be maintained at a voltage that is equal to, or greater than, the magnitude of the output voltage at the threshold magnetic field. In other words, although the MR bridge circuit may saturate at stronger magnetic fields, the modification circuit may modify operation of the MR bridge circuit such that the output voltage of the MR bridge circuit does not present the saturation effect to the control circuit of the closed loop current sensing system.

In some examples according to the present disclosure, a system comprises an MR bridge circuit, a magnetic field sensor, and a first adjustable load. The MR bridge circuit is configured to receive a supply voltage between a supply node and a ground node, and configured to generate an output voltage that indicates a strength and direction of a magnetic field. The MR bridge circuit comprises first and second MR elements connected in series between the supply node and the ground node, and third and fourth MR elements connected in series between the supply node and the ground node. The output voltage is generated between a first node that is common to the first and second MR elements and a second node that is common to the third and fourth MR elements. The magnetic field sensor is configured to generate signals based on the strength and direction of the magnetic field. The first adjustable load is connected in parallel with one of the MR elements. The first adjustable load has a first resistance that is controlled based on the signals generated by the magnetic field sensor.

In other examples according to the present disclosure, a system comprises an MR bridge circuit, a magnetic field sensor, a first adjustable load, and a second adjustable load. The MR bridge circuit is configured to generate an output voltage that indicates a strength and direction of a magnetic field. The magnetic field sensor is configured to generate signals based on the strength and direction of the magnetic field. The first adjustable load is connected to the MR bridge circuit. The first adjustable load has a first resistance that is controlled based on the signals generated by the magnetic field sensor. The second adjustable load is connected to the MR bridge circuit. The second adjustable load has a second resistance that is controlled based on the signals generated by the magnetic field sensor. The output voltage generated by the MR bridge circuit is dependent on the values of the first and second resistances.

In other examples according to the present disclosure, a method comprises generating an output voltage that indicates a strength and direction of a magnetic field using an MR bridge circuit. The method further comprises generating signals based on the strength and direction of the magnetic field using a magnetic field sensor. The method further comprises controlling a first resistance included in a first adjustable load based on the signals generated by the magnetic field sensor. The first adjustable load is connected to the MR bridge circuit. Additionally, the method comprises controlling a second resistance included in a second adjustable load based on the signals generated by the magnetic field sensor. The second adjustable load is connected to the MR bridge circuit. The output voltage is generated based on the values of the first and second resistances.

The details of one or more examples are set forth in the accompanying drawings and the description below. Other features, objects, and advantages will be apparent from the description and drawings, and from the claims.

DETAILED DESCRIPTION

Figure 1:
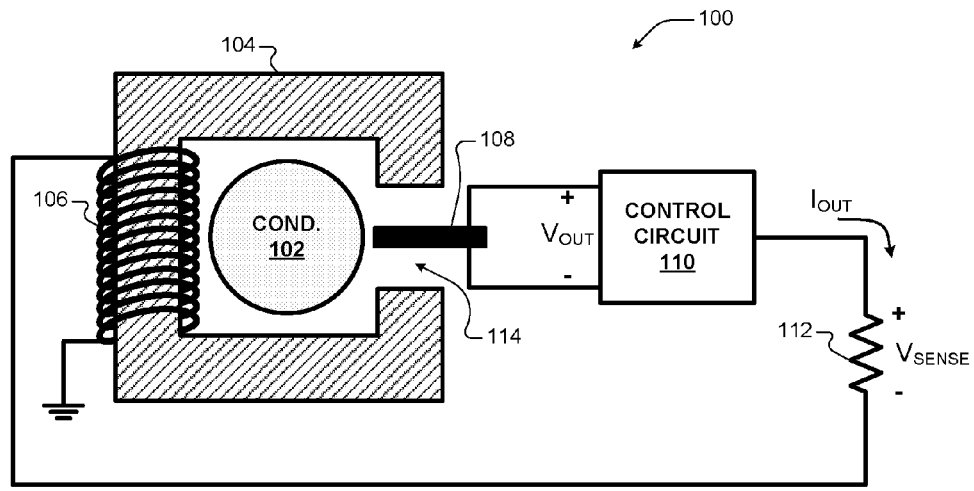
FIG. 1 is a block diagram that shows a closed-loop current sensing system that may be used to measure an amount of current through a conductor.

FIG. 1 is a block diagram that shows a closed-loop current sensing system 100 (hereinafter, "sensing system 100") that may be used to measure an amount of current through conductor 102. Conductor 102 may represent any conductor, such as a metal wire or cable. For example, conductor 102 may represent any wire (or cable) that carries current in any of a variety of different applications. Some applications may include power monitoring applications. For example, conductor 102 may represent a conductor that carries current generated by a solar panel, a wind turbine, or an electrical power system in a hybrid electric vehicle. In these examples, sensing system 100 may monitor current through conductor 102 as current is switched between different states. In the case of a solar panel or a wind turbine, sensing system 100 may monitor current as the electrical load is switched, e.g., from powering a building to powering an electric grid, which may tend to cause abrupt changes in the amount of current being delivered via conductor 102.

FIG. 1 illustrates a cross-section of conductor 102. The cross-section of conductor 102 is meant to illustrate that conductor 102 may extend into and out of the page. Current through conductor 102 may generate a magnetic field according to the right hand rule. According to the illustration of FIG. 1, current through conductor 102 in a direction that extends out of the page may generate a magnetic field in a counter-clockwise direction. Alternatively, current through conductor 102 in a direction that extends into the page may generate a magnetic field in a clockwise direction. The magnitude and direction of the magnetic field generated by current through conductor 102 may indicate the amount of current and the direction of current through conductor 102. Sensing system 100 may be used to measure the amount of current and the direction of current through conductor 102 based on the generated magnetic field.

Sensing system 100 includes a core 104, a coil 106, a magnetic field sensor 108, a control circuit 110, and a sense resistor 112. Core 104 may include a ferromagnetic material such as iron, cobalt, or nickel, for example. Core 104 may be a solid core or may be a lamination stack, for example. Core 104 may define a gap region 114 in which one or more magnetic field sensors may be located. For example, gap region 114 may include magnetic field sensor 108 of FIG. 1 and FIG. 7, and hall sensor 136 of FIG. 5. Core 104 may concentrate the magnetic flux generated by conductor 102 in gap region 114. Although core 104 is illustrated in FIG. 1 as a rectangular doughnut core that defines gap region 114, it is contemplated that sensing system 100 may include cores having other geometries.

The magnetic field generated by conductor 102 may induce a magnetic field in core 104 that crosses gap region 114. In general, the magnetic field may cross gap region 114 in one of two directions which may be referred to herein as a positive direction and a negative direction, the negative direction being in an opposite direction to that of the positive direction.

Magnetic field sensor 108 generates signals that indicate the strength and direction of the magnetic field in gap region 114. The signals generated by magnetic field sensor 108 are illustrated as output voltage "$V_{OUT}$" in FIG. 1. The polarity of $V_{OUT}$ may indicate the direction of the magnetic field in gap region 108. For example, a positive value of $V_{OUT}$ may indicate that the magnetic field in gap region 114 is in the positive direction, while a negative value of $V_{OUT}$ may indicate that the magnetic field in gap region 114 is in the negative direction. Although the signals that indicate the strength and direction of the magnetic field in gap region 114 are illustrated and described herein as voltage signals, it is contemplated that sensing systems according to the present disclosure may determine the strength and direction of the magnetic field in gap region based on current measurements.

Magnetic field sensor 108 may include a plurality of magnetoresistive (MR) elements arranged in a bridge configuration, e.g., a Wheatstone bridge configuration. As described hereinafter, magnetic field sensor 108 is described as a Wheatstone bridge circuit that includes anisotropic MR (AMR) elements in a Wheatstone bridge configuration. Accordingly, magnetic field sensor 108 may be referred to herein as an "AMR bridge sensor 108" or an "AMR bridge circuit 108." The configuration of AMR bridge sensor 108 and operation of AMR bridge sensor 108 is described hereinafter with respect to FIGS. 2, 3A-3B, and 4A-4B.

Control circuit 110 receives signals (e.g., $V_{OUT}$) generated by AMR bridge sensor 108. As described above, the magnitude and polarity of $V_{OUT}$ may indicate the magnitude and polarity of the magnetic field in gap region 114. Control circuit 110 is configured to generate an output current "$I_{OUT}$" based on the voltage $V_{OUT}$ generated by AMR bridge sensor 108. Control circuit 110 drives current $I_{OUT}$ through sense resistor 112 and coil 106. Current $I_{OUT}$ through coil 106 may generate a magnetic field. Core 104 may concentrate the magnetic flux generated by coil 106 in gap region 114. In this manner, the magnitude and direction of the magnetic field generated in gap region 114 by coil 106 may be controlled by control circuit 110. In some examples, control circuit 110 may generate $I_{OUT}$ in a direction that generates a magnetic field in the positive direction in gap region 114. In other examples, control circuit 110 may generate $I_{OUT}$ in a direction that generates a magnetic field in the negative direction in gap region 114.

In some examples, control circuit 110 may include high impedance inputs at the nodes at which $V_{OUT}$ is detected, such that control circuit 110 does not load AMR bridge sensor 108. In other words, the input impedance into control circuit 110 may be large enough that the amount of current flowing into control circuit 110 when $V_{OUT}$ is applied to control circuit 110 may be negligible (i.e., near zero). In some examples, the input stage of control circuit 110 may include a high input impedance device, such as an operational amplifier.

Control circuit 110 is configured to receive $V_{OUT}$ from AMR bridge sensor 108 that indicates the magnitude and polarity of the magnetic field in gap region 114. In general, control circuit 110 may generate $I_{OUT}$ in order to drive the magnitude of the magnetic field in gap region 114 towards zero. In other words, control circuit 110 may be configured to generate a magnetic field in gap region 114 that is equal in magnitude and opposite in direction to the magnetic field in gap region 114 that is generated by current through conductor 102. In examples where the magnetic field in gap region 114 generated by conductor 106 is in the positive direction, control circuit 110 may, based on the magnitude and polarity of $V_{OUT}$, generate current $I_{OUT}$ to generate a magnetic field in the negative direction in gap region 114 in order to drive the magnetic field in gap region 114 towards zero. Similarly, in examples where the magnetic field in gap region 114 generated by conductor 102 is in the negative direction, control circuit 110 may, based on the magnitude and polarity of $V_{OUT}$, generate current $I_{OUT}$ to generate a magnetic field in the positive direction in gap region 114 in order to drive the magnetic field in gap region 114 towards zero.

It may be assumed herein that the magnetic field strength in gap region 114 is 0 Oe when $V_{OUT}$ is equal to 0V. Additionally, it may be assumed that a magnetic field that deviates from 0 Oe towards a more positive magnetic field strength may cause $V_{OUT}$ to deviate from 0V towards a more positive voltage. Similarly, it may be assumed that a magnetic field that deviates from 0 Oe towards a more negative magnetic field strength may cause $V_{OUT}$ to deviate from 0V to a more negative voltage.

Control circuit 110 is configured to generate current $I_{OUT}$ through coil 106 based on the magnitude and polarity of $V_{OUT}$. In general, control circuit 110 is configured to generate current $I_{OUT}$ in order to drive $V_{OUT}$ towards a value of zero volts, i.e., the value of $V_{OUT}$ that indicates 0 Oe in gap region 114. In examples where $V_{OUT}$ indicates a magnetic field in gap region 114 having a positive direction, control circuit 110 may generate $I_{OUT}$ through coil 106 that generates a magnetic field having a negative direction component in gap region 114. In examples where $V_{OUT}$ indicates a magnetic field in gap region 114 having a negative direction, control circuit 110 may generate current $I_{OUT}$ through coil 106 that generates a magnetic field having a positive direction component in gap region 114. In other words, control circuit 110 may be configured to generate $I_{OUT}$ through coil 106 such that the magnetic field generated by coil 106 causes the magnetic field in gap region 114 to be driven towards zero.

The magnitude and direction of $I_{OUT}$ generated by control circuit 112 may indicate the magnitude and direction of current through conductor 102. For example, the magnitude and direction of $I_{OUT}$ may be indicative of the magnitude and direction of current through conductor 102 when the magnetic field in gap region 114 is approximately equal to 0 Oe. In this example, when control circuit 110 has generated $I_{OUT}$ such that $V_{OUT}$ is driven to zero, the magnitude of $I_{OUT}$ may be proportional to the magnitude of current through conductor 102, and the direction of $I_{OUT}$ may indicate the direction of current through conductor 102. The proportionality relationship between the magnitude of the current through conductor 102 and $I_{OUT}$ may be defined by the ratio of the number of turns in coil 106 to the number of turns in conductor 102.

The magnitude and direction of $I_{OUT}$ may be measured by a voltage measurement circuit (not shown). The voltage measurement circuit may determine the magnitude and direction of current through conductor 102 based on the measured magnitude and polarity of the voltage drop "$V_{SENSE}$" across sense resistor 112. The voltage measurement circuit may include, for example, a signal conditioning circuit (e.g., a filtering and amplification circuit) and an analog-to-digital converter (ADC) circuit. The filtering and amplification circuit may condition the voltage signal $V_{SENSE}$ for conversion to a digital value by the ADC circuit, the digital value representing the magnitude and direction of current through conductor 102. Such a digital value may be processed by a digital computing device (not shown) to determine the magnitude and direction of current through conductor 102, e.g., based on the ratio of the number of turns in coil 106 to the number of turns in conductor 102.

Figure 2:
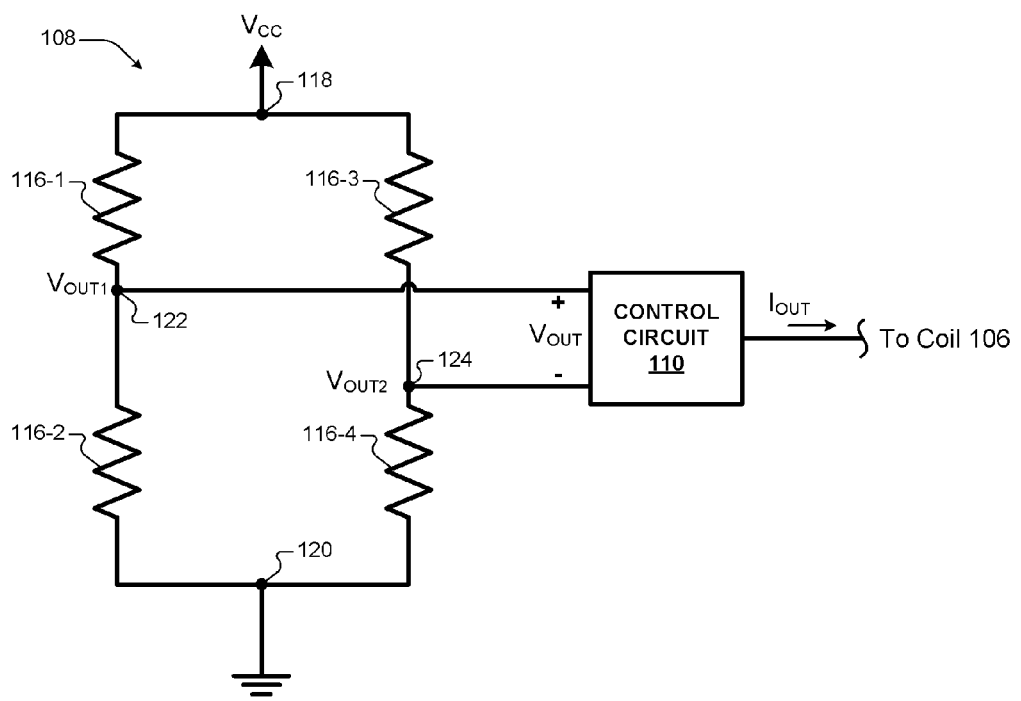
FIG. 2 shows a schematic of an anisotropic magnetoresistive (AMR) bridge sensor connected to a control circuit.

FIG. 2 shows a schematic of AMR bridge sensor 108 connected to control circuit 110. AMR bridge sensor 108 may be used to measure the strength and direction of the magnetic field in gap region 114. AMR bridge sensor 108 includes four AMR elements 116-1, 116-2, 116-3, 116-4 (collectively "AMR elements 116") that are each represented as resistors. Each of AMR elements 116 may change in resistance in response to a magnetic field. In some examples, AMR elements 116 may be made from thin (10-1000 A) permalloy films, permalloy being an approximately 80% Ni/20% Fe alloy. In some examples, each of AMR elements 116 may represent a single AMR device. In other examples, AMR elements 116 may each include multiple AMR devices connected together. Accordingly, each of AMR elements 116 may include one or more AMR devices, and one or more AMR devices may be represented as a single resistor in the present disclosure.

AMR bridge sensor 108 includes two legs, each of the two legs including two AMR elements. The first leg of AMR bridge sensor 108 includes AMR elements 116-1, 116-2 connected in series between a power supply node 118 of AMR bridge sensor 108 and a ground node 120 of AMR bridge sensor 108. The second leg of AMR bridge sensor 108 includes AMR elements 116-3, 116-4 connected in series between power supply node 118 and ground node 120. Each of AMR elements 116 may be located in gap region 114 and each of AMR elements 116 may be exposed to the magnetic field in gap region 114.

Power supply voltage $V_{CC}$ (e.g., a DC voltage) may be applied across AMR bridge sensor 108 between power supply node 118 and ground node 120. Supply voltage $V_{CC}$ may be applied across the series combination of AMR elements 116-1, 116-2 of the first leg of AMR bridge sensor 108. The power supply voltage $V_{CC}$ is divided across AMR elements 116-1, 116-2 to produce voltage $V_{OUT1}$ at node 122 which is common to AMR elements 116-1, 116-2. The power supply voltage $V_{CC}$ may also be applied across the series combination of AMR elements 116-3, 116-4 of the second leg of AMR bridge sensor 108. The supply voltage $V_{CC}$ is divided across AMR elements 116-3, 116-4 to produce voltage $V_{OUT2}$ at node 124 which is common to both AMR elements 116-3, 116-4.

Nodes 122, 124 are connected to control circuit 110. AMR bridge sensor 108 presents output voltage $V_{OUT}$ to control circuit 110 between nodes 122 and 124. As illustrated and described herein, output voltage $V_{OUT}$ is the difference between the voltages at nodes 122 and 124, i.e., voltage $V_{OUT1}$ minus voltage $V_{OUT2}$. The output voltage $V_{OUT}$ may vary in magnitude and polarity, depending on the resistances of AMR elements 116. As described above, the resistances of AMR elements 116 may vary based on the magnitude and direction of the magnetic field in gap region 114. Accordingly, $V_{OUT}$ may vary in magnitude and polarity, depending on the magnitude and direction of the magnetic field in gap region 114. The variation in resistances of AMR elements 116 and the corresponding variations in the output voltage $V_{OUT}$ for varying magnetic fields in gap region 114 are described in more detail with respect to FIGS. 3A-3B and FIGS. 4A-4B.

Figure 3A:
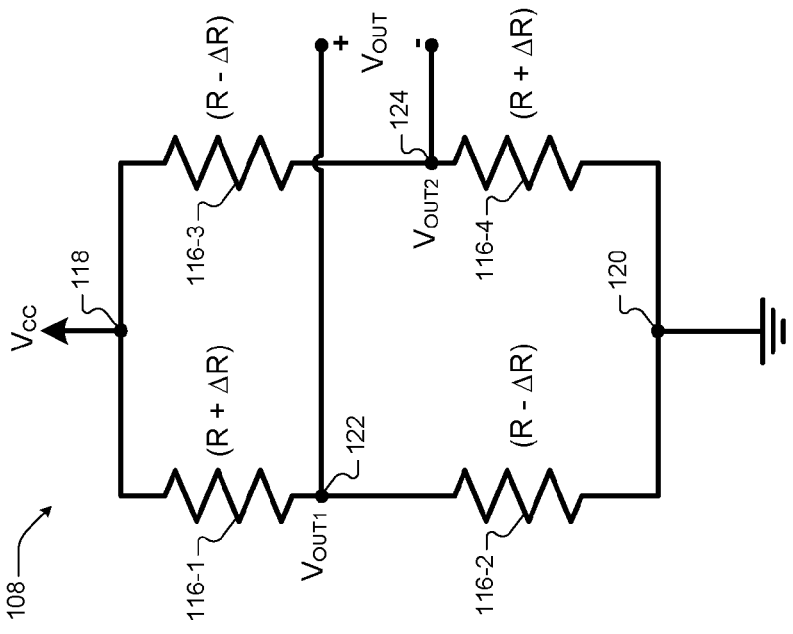
FIGS. 3A-3B are schematics that illustrate how the resistances of AMR elements, included in the AMR bridge sensor of FIG. 2, change in response to a magnetic field.
Figure 3B:
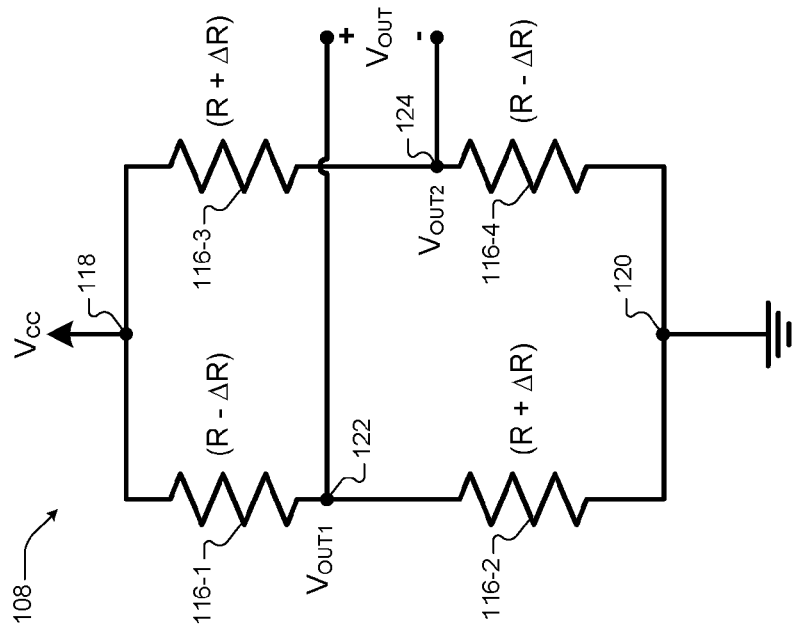
Figure 4A:
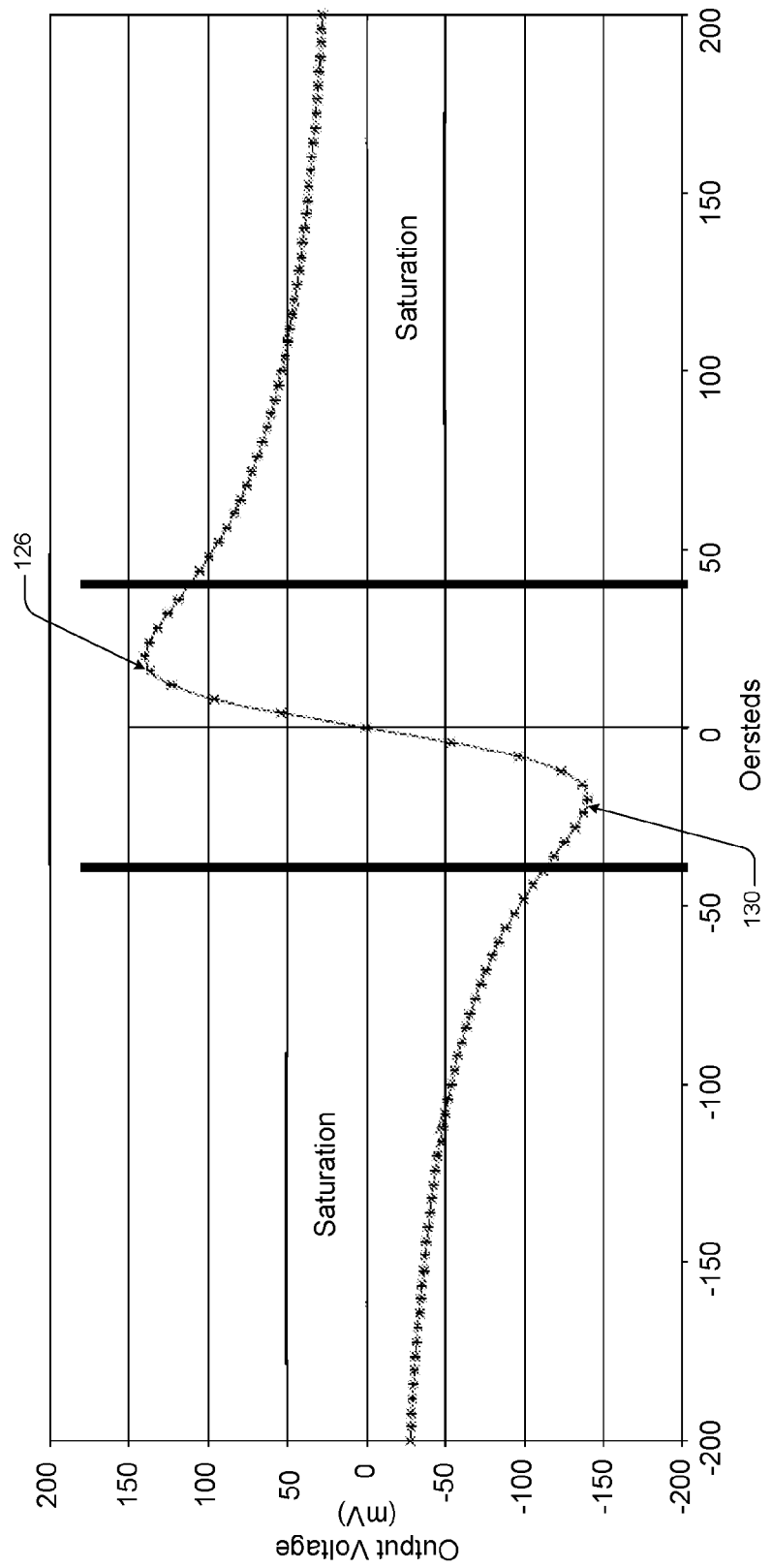
FIGS. 4A-4B are graphs that illustrate example output voltage waveforms of the AMR bridge sensor of FIG. 2.
Figure 4B:
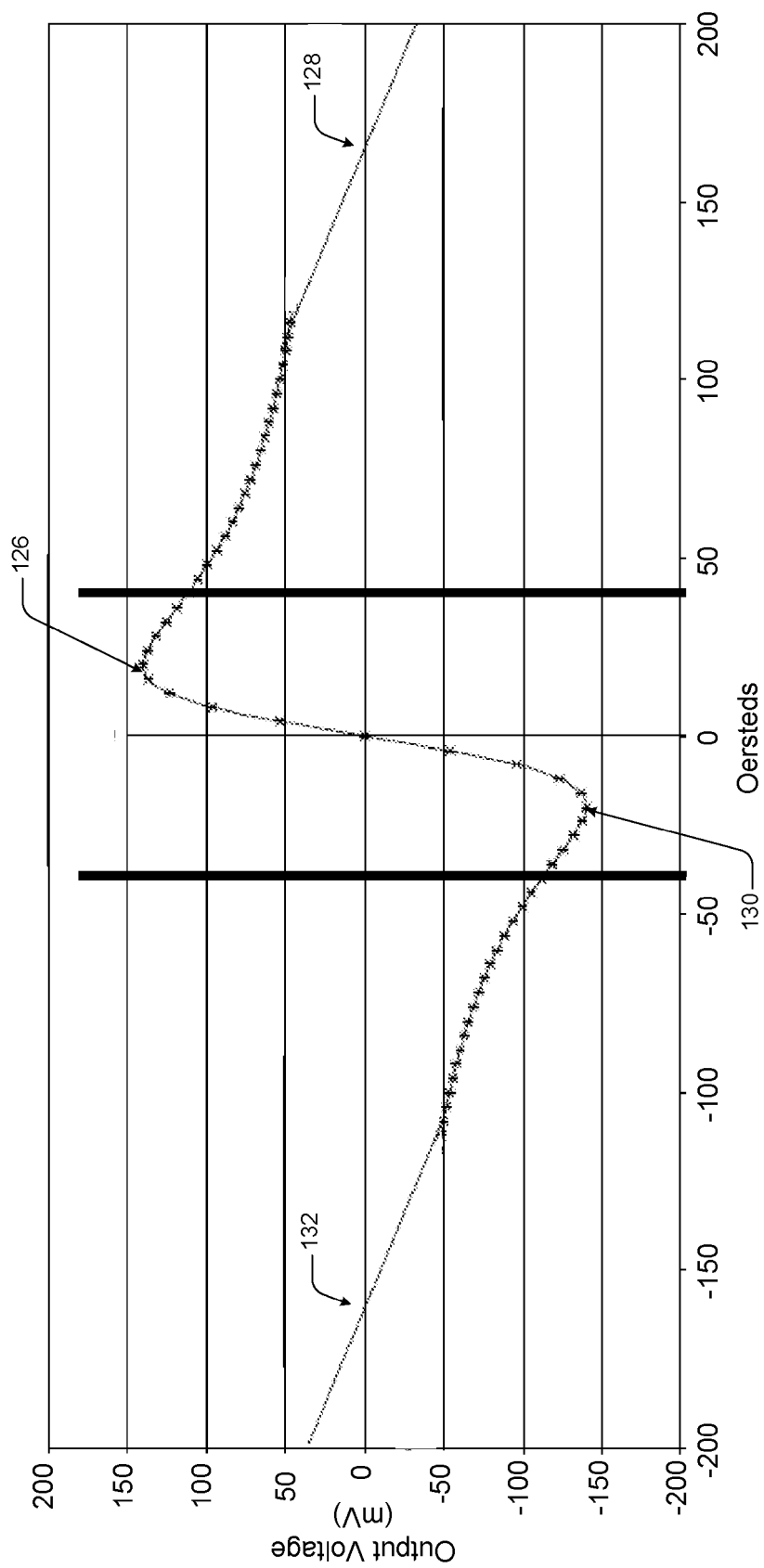

FIGS. 3A-3B illustrate how the resistances of AMR elements 116 change in response to a magnetic field in gap region 114. FIG. 3A illustrates changes in the resistances of AMR elements 116 during application of a magnetic field in the positive direction in gap region 114. FIG. 3B illustrates changes in the resistances of AMR elements 116 during application of a magnetic field in the negative direction in gap region 114. FIGS. 4A-4B are graphs that illustrate example output voltage waveforms with respect to the magnetic field strength and direction in gap region 114.

AMR elements 116 may be configured to have approximately equal resistances when the magnitude of the magnetic field in gap region 114 is approximately 0 Oe. As illustrated in FIGS. 3A-3B, the resistances of AMR elements 116 may have a resistive value of "R" ohms (Ω) when the magnetic field in gap region 114 is approximately 0 Oe. In some implementations, the value R may range from approximately 100Ω up to 1 MΩ. For example, the value R may be approximately 1 kΩ in examples where AMR elements 116 are permalloy devices. The value ΔR may range from approximately 2-3% in some examples. Output voltage $V_{OUT}$ may be approximately equal to 0V when the magnetic field in gap region 114 is approximately equal to 0 Oe since each of AMR elements 116 may have approximately the same resistance at 0 Oe. An output voltage $V_{OUT}$ of 0V at a magnetic field strength of 0 Oe is illustrated in FIGS. 4A-4B.

FIG. 3A shows the change in resistance of AMR elements 116 in response to the magnetic field in gap region 114 increasing from 0 Oe to a more positive magnetic field value (e.g., approximately 25 Oe). FIG. 3A shows that AMR element 116-2 increases in resistance by a value of ΔR in response to a positive magnetic field in gap region 114, while AMR element 116-1 decreases in resistance by a value of ΔR in response to a positive magnetic field in gap region 114. Voltage $V_{OUT1}$ increases in magnitude, e.g., towards power supply voltage $V_{CC}$, in response to the changes in resistances of AMR elements 116-1, 116-2 as the strength of the magnetic field increases from 0 Oe to a larger positive value. FIG. 3A also shows that AMR element 116-4 decreases in resistance by a value of ΔR in response to a positive magnetic field in gap region 114, while AMR element 116-3 increases in resistance by a value of ΔR in response to a positive magnetic field in gap region 114. Voltage $V_{OUT2}$ decreases in magnitude, e.g., towards ground, in response to the changes in resistances of AMR elements 116-3, 116-4 as the strength of the magnetic field increases from 0 Oe to a larger positive value. Accordingly, output voltage $V_{OUT}$ may tend to increase from 0V to a more positive value in response to the increase in the strength of the magnetic field in gap region 114 from 0 Oe to a more positive value.

Referring now to FIGS. 4A-4B, the output voltage $V_{OUT}$ may initially increase to a more positive value as the magnetic field in gap region 114 increases from 0 Oe to a more positive value. However, at a positive threshold field (e.g., approximately 25 Oe), indicated at 126, the output voltage $V_{OUT}$ may level off and start to decrease in magnitude as the magnetic field in gap region 114 continues to increase in magnitude to a value that is greater than 25 Oe.

Output voltage $V_{OUT}$ may continue to decrease as the strength of the magnetic field increases beyond the positive threshold field. For example, the output voltage $V_{OUT}$ may decrease towards a value of 0V as the magnetic field increases beyond the positive threshold field. In some examples, the output voltage $V_{OUT}$ may even decrease to a value that is less than 0V, as illustrated in FIG. 4B at 128.

The decrease in output voltage $V_{OUT}$ for magnetic fields greater than the positive threshold field may be caused by "saturation" of AMR elements 116. Saturation of AMR elements 116 may refer to a scenario in which the resistances of AMR elements 116 may tend towards similar resistive values when exposed to magnetic fields having a strength that is greater than positive threshold field. During saturation of AMR elements 116, the resistive relationships between AMR elements 116 may not behave as illustrated in FIG. 3A. For example, AMR elements 116-2, 116-3 may not continue to increase in resistance for magnetic fields that are greater than the positive threshold field and AMR elements 116-1, 116-4 may not continue to decrease in resistance for magnetic fields that are greater than the positive threshold field. Instead, as the magnetic field in gap region 114 increases to a value greater than the positive threshold field, the resistances of AMR elements 116 may each saturate towards a similar value, illustrated as $R_{SAT}$ in FIGS. 8A-8B and FIGS. 9A-9B. Saturation of AMR elements 116 towards a similar resistive value in the presence of strong magnetic fields (e.g., greater than the positive threshold field), may cause the output voltage $V_{OUT}$ to transition towards 0V. In some examples, as described above, saturation of AMR elements 116 may even have the effect of causing the output voltage $V_{OUT}$ to cross over 0V and reverse in polarity.

The modification circuit of the present disclosure may modify operation of AMR bridge sensor 108 to prevent the output voltage $V_{OUT}$ from transitioning towards 0V for magnetic fields that are greater than the positive threshold field. For example, the modification circuit may cause $V_{OUT}$ to be maintained at a voltage that is greater than or equal to the output voltage $V_{OUT}$ at the positive threshold field for magnetic fields that are greater than the positive threshold field. In other words, although AMR elements 116 may saturate at stronger magnetic fields, the modification circuit may modify operation of AMR bridge sensor 108 such that the output voltage $V_{OUT}$ does not present the saturation effect to control circuit 110. Example modification circuits are described hereinafter with respect to FIGS. 5-11. An example output voltage waveform presented by AMR bridge sensor 108 when the modification circuit is connected to AMR bridge sensor 108 is illustrated in FIG. 6.

A similar saturation effect, as described above with respect to positive magnetic fields, may also be observed when AMR bridge sensor 108 is subjected to magnetic fields in the negative direction. Operation of AMR bridge sensor 108 and a saturation of AMR bridge sensor 108 in the presence of magnetic fields having a negative direction are now described with respect to FIG. 3B and FIGS. 4A-4B.

FIG. 3B shows the change in resistance of AMR elements 116 in response to the magnetic field in gap region 114 transitioning from a value of 0 Oe to a negative magnetic field value (e.g., approximately −25 Oe). AMR element 116-1 increases in resistance by a value of ΔR in response to a negative magnetic field in gap region 114, while AMR element 116-2 decreases in resistance by a value of ΔR in response to a negative magnetic field in gap region 114. Voltage $V_{OUT1}$ decreases, e.g., towards ground, in response to the changes in resistances of AMR elements 116-1, 116-2 as the magnetic field transitions from 0 Oe to a more negative value. FIG. 3B also shows that AMR element 116-3 decreases in resistance by a value of ΔR in response to a negative magnetic field in gap region 114, while AMR element 116-4 increases in resistance by a value of ΔR in response to a negative magnetic field in gap region 114. Voltage $V_{OUT2}$ increases in magnitude, e.g., towards power supply voltage $V_{CC}$, in response to the changes in resistances of AMR elements 116-3, 116-4 as the magnetic field transitions from 0 Oe to a more negative value. Based on the above description of voltages $V_{OUT1}$ and $V_{OUT2}$, the output voltage $V_{OUT}$ may transition from 0V to a more negative value in response to a transition of the magnetic field from 0 Oe towards a more negative value.

Referring now to FIGS. 4A-4B, the output voltage $V_{OUT}$ may initially transition from 0V to a more negative voltage as the magnetic field in gap region 114 transitions from 0 Oe to a more negative value. However, at a negative threshold field (e.g., approximately −25 Oe), indicated at 130, the output voltage $V_{OUT}$ may start to decrease in magnitude as the magnetic field in gap region 114 transitions towards a larger negative value (e.g., towards −200 Oe). For example, output voltage $V_{OUT}$ may transition towards 0V as the magnetic field transitions from the negative threshold field to a more negative value. In some examples, the output voltage $V_{OUT}$ may even switch polarity, i.e., transition from a negative voltage to a positive voltage, as illustrated in FIG. 4B at 132.

The modification circuit of the present disclosure may modify operation of AMR bridge sensor 108 to prevent the output voltage $V_{OUT}$ from transitioning towards 0V as the magnetic field transitions from the negative threshold field towards a more negative value. For example, the modification circuit may cause $V_{OUT}$ to be maintained at a negative voltage that is equal to or greater in magnitude than the output voltage $V_{OUT}$ at the negative threshold field for magnetic fields that are more negative than the negative threshold field. In other words, although AMR elements 116 may saturate in strong negative magnetic fields, the modification circuit may modify operation of AMR bridge sensor 108 such that the output voltage $V_{OUT}$ does not present the saturation effect to control circuit 110.

Referring back to FIG. 2, control circuit 110 generates current $I_{OUT}$ through coil 106 in order to drive the magnetic field in gap region 114 towards 0 Oe where the voltage measurement circuit may determine the amount of current through conductor 102 and where AMR bridge sensor 108 may provide a highly accurate measurement of the magnetic field. For example, if control circuit 110 detects a positive value of $V_{OUT}$, control circuit 110 may generate current a value of $I_{OUT}$ that generates a magnetic field in the negative direction in order to zero-out the value of the magnetic field in gap region 114. Alternatively, if control circuit 110 detects a negative value of $V_{OUT}$, control circuit 110 may generate a current value of $I_{OUT}$ that generates a magnetic field in the positive direction in order to zero-out the value of the magnetic field in gap region 114. Control circuit 110 may continuously operate as described above in order to maintain the output voltage $V_{OUT}$ at approximately 0V, so that the voltage measurement circuit may measure $V_{SENSE}$ and determine the amount of current through conductor 102.

In order for sensing system 100 to provide for reliable and accurate measurement of the current through conductor 102, control circuit 110 should reliably maintain the magnetic field in gap region 114 at approximately 0 Oe. In other words, control circuit 110 should reliably control the magnitude and polarity of current $I_{OUT}$ in order to maintain the magnetic field in gap region 114 at approximately 0 Oe. In examples where the current through conductor 102 includes only relatively low frequency components, e.g., DC or near DC, control circuit 110 may generate current $I_{OUT}$ such that the generated current $I_{OUT}$ reliably maintains the magnetic field in gap region 114 at 0 Oe. However, in some examples, if the current through conductor 102 includes higher frequency signal components, control circuit 110 may have a more difficult time generating the appropriate value of $I_{OUT}$ to maintain the magnetic field in gap region 114. In other words, when current through conductor 102 rapidly changes, control circuit 110 may not reliably generate an appropriate value of $I_{OUT}$ to maintain the magnetic field in gap region 114 at 0 Oe.

The control issues with control circuit 110 (e.g., in the presence of rapid fluctuations in conductor current) may arise due to the presence of the saturation effect in AMR bridge sensor 108. The control issues may be caused because control circuit 110 may not reliably determine the strength of the magnetic field in gap region 114 based on the magnitude of the output voltage $V_{OUT}$. For example, with respect to FIGS. 4A-4B, the output voltage $V_{OUT}$ may, in some examples, have the same value when the magnetic field is less than the positive threshold field as when the magnetic field is greater than the positive threshold field. Similarly, with respect to negative magnetic fields, the output voltage $V_{OUT}$ may have the same value when the magnetic field is more negative than the negative threshold field as when the magnetic field has a value between 0 Oe and the negative threshold field.

The magnitude and rate of change of $I_{OUT}$ required to drive the magnetic field in gap region 114 to 0 Oe may depend on the current magnetic field in gap region 114. For example, a larger current $I_{OUT}$ may be required to drive a larger magnetic field to 0 Oe, while a smaller current $I_{OUT}$ may be required to drive a smaller magnetic field to 0 Oe. Since the voltage $V_{OUT}$ may ambiguously indicate the strength of the magnetic field in gap region 114 due to the saturation effect, control circuit 110 may not reliably determine the amount of current $I_{OUT}$ to generate in order to drive the magnetic field in gap region 114 to 0 Oe in the presence of rapid and/or large fluctuations in current through conductor 102. In other words, the ambiguity present with respect to $V_{OUT}$ and the strength of the magnetic field may cause issues in sensing system 100 when the current through conductor 102 fluctuates rapidly. For example, control circuit 110, based on the present voltage $V_{OUT}$, may not reliably determine an accurate amount of current $I_{OUT}$ to generate. In some examples, control circuit 110 may generate a current $I_{OUT}$ that is too small to zero out the magnetic field, e.g., when control circuit 110 interprets the voltage $V_{OUT}$ as indicating a magnetic field that is less than the positive threshold field but the actual magnetic field is greater than the positive threshold field. In other examples, control circuit 110 may generate a current that is too large, which may drive the magnetic field past 0 Oe and in the negative direction, e.g., when control circuit 110 interprets the voltage $V_{OUT}$ as indicating a magnetic field that is greater than the positive threshold field but the actual magnetic field is less than the positive threshold field. Additionally, in some examples, if control circuit 110 senses the magnetic field in the wrong direction, e.g., due to rapid fluctuations, current $I_{OUT}$ may be generated in a manner that may actually drive the magnetic field in gap region 114 away from 0 Oe.

The modification circuit of the present disclosure may modify operation of AMR bridge sensor 108 such that the saturation effect observed at the output of AMR bridge sensor 108 is eliminated. For example, the modification circuit of the present disclosure may modify the output voltage of AMR bridge sensor 108 such that the output voltage of the AMR bridge sensor 108 does not saturate when subjected to magnetic fields having strengths that are greater than the positive/negative threshold fields. The modification circuit may modify operation of AMR bridge sensor 108 such that AMR bridge sensor 108 outputs a positive voltage that monotonically increases in response to positive magnetic fields of increasing strength. Additionally, the modification circuit may modify operation of AMR bridge sensor 108 such that AMR bridge sensor 108 outputs a negative voltage that monotonically increases in response to negative magnetic fields of increasing strength.

Figure 5:
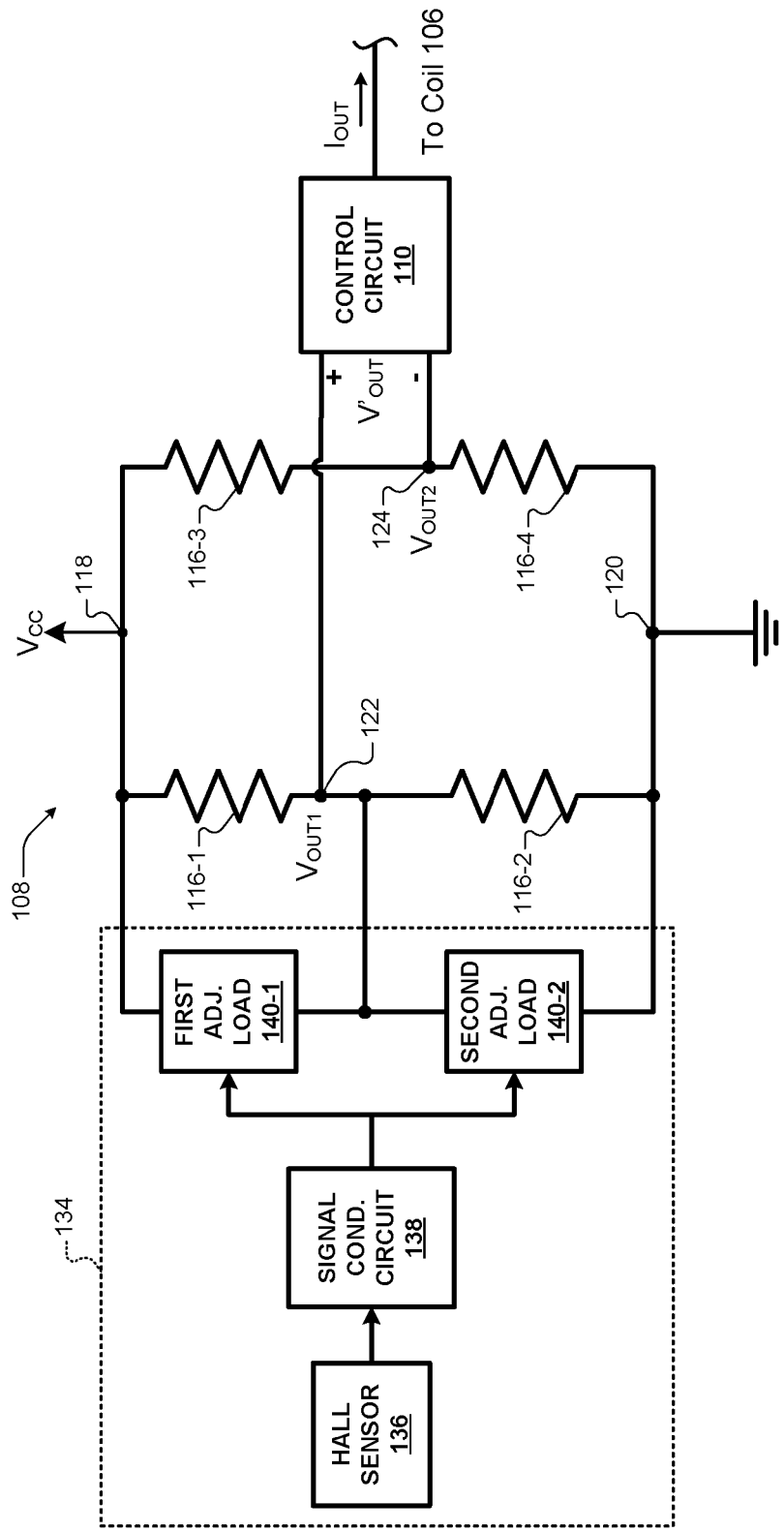
FIG. 5 shows an example modification circuit of the present disclosure that modifies the operation of the AMR bridge sensor of FIG. 2.
Figure 6:
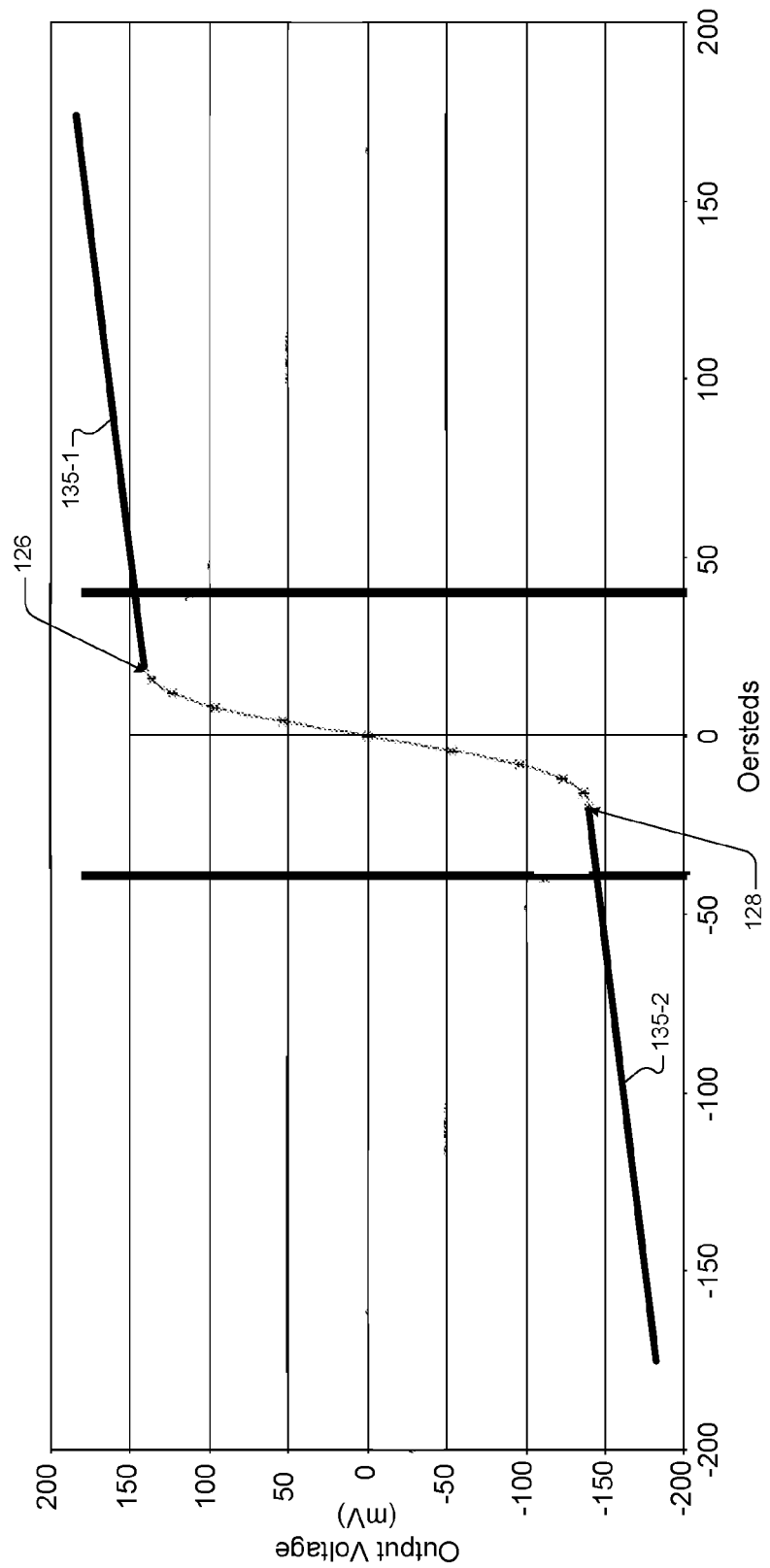
FIG. 6 is a graph that illustrates an example output voltage waveform of the AMR bridge sensor of FIG. 5 as modified by the modification circuit.
Figure 7:
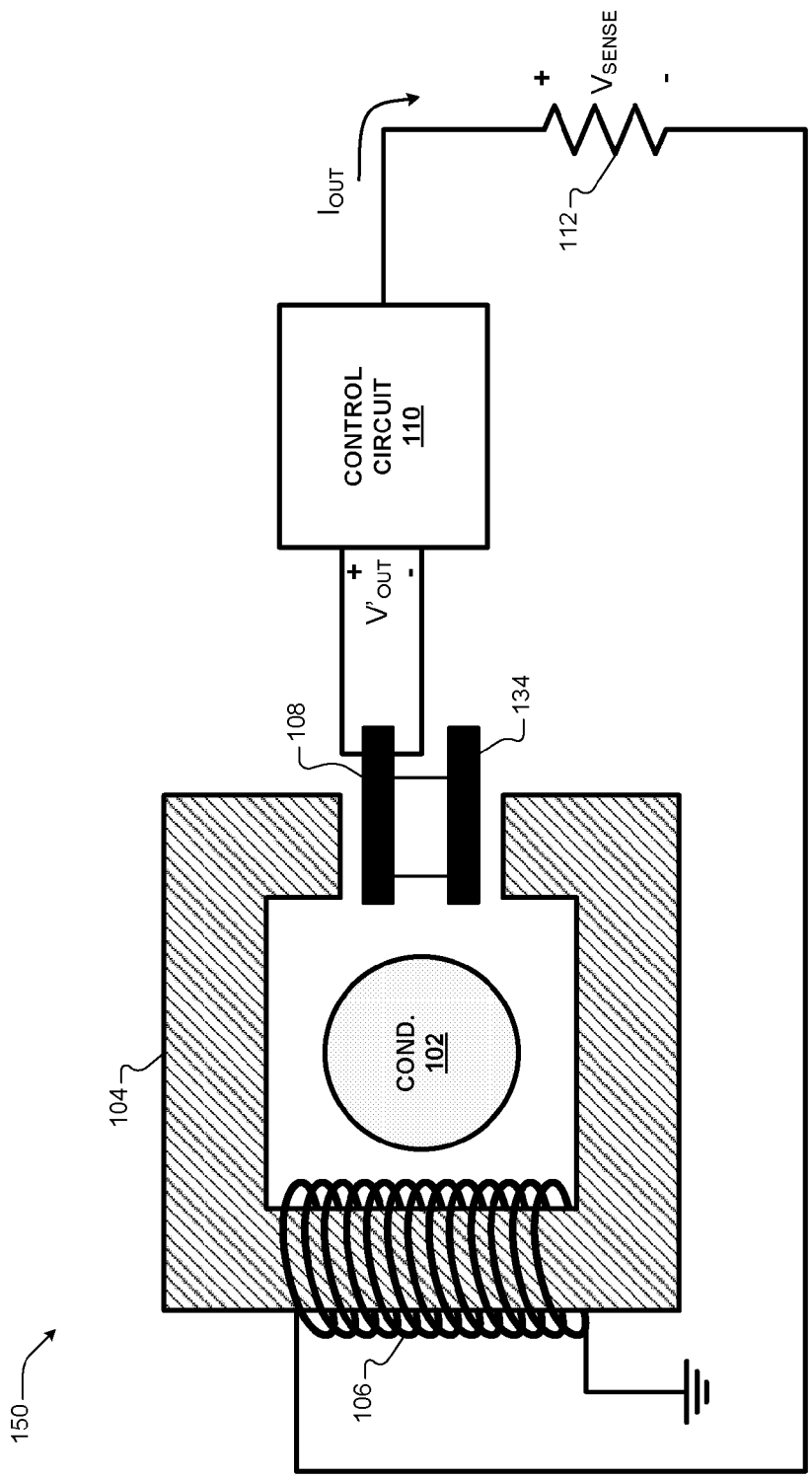
FIG. 7 shows an example closed loop current sensing system including an example modification circuit of the present disclosure.

FIG. 5 shows an example modification circuit 134 that modifies the operation of AMR bridge sensor 108 to produce an output voltage $V'_{OUT}$. Hereinafter, voltage $V'_{OUT}$ is used to denote the output voltage of AMR bridge sensor 108 that is modified by a modification circuit (e.g., modification circuit 134 of FIG. 5). The output voltage $V'_{OUT}$ may monotonically increase in magnitude in response to an increase in strength of the magnetic field in gap region 114, which is in contrast to output voltage $V_{OUT}$ that sags when the magnitude of the magnetic field transitions from a value that is less than the positive/negative threshold field to a value that is greater than the positive/negative threshold field. An example of voltage $V'_{OUT}$ is illustrated in FIG. 6. An example closed loop current sensing system 150 including modification circuit 134 is illustrated in FIG. 7.

As illustrated in FIG. 6, $V'_{OUT}$ may be a positive voltage that monotonically increases as the strength of the magnetic field in gap region 114 increases from a value of 0 Oe to a value of 200 Oe. As another example, $V'_{OUT}$ may be a negative voltage that monotonically increases in magnitude as the magnetic field increases in strength from 0 Oe to −200 Oe. The portions of the $V'_{OUT}$ curve that are modified by modification circuit 134 are indicated using bold lines, at 135-1, 135-2. Although the portions of the $V'_{OUT}$ curve that are modified by modification circuit 134 are shown as including a small positive slope, it is contemplated that the portions could include different slope values. For example, the portions may have zero slope in some examples. In other examples, the portions may have greater slope values. Although the portions of $V'_{OUT}$ that are modified by modification circuit 134 are illustrated as linear, in some examples, the portions may include curved portions. Accordingly, based on the portions of $V'_{OUT}$ that are modified by a modification circuit according to the present disclosure may take on a variety of different slopes and shapes, which may be dependent on the operating characteristics of the modification circuit and the AMR bridge sensor to which the modification circuit is attached.

Referring now to FIG. 5, modification circuit 134 includes a hall sensor 136, a signal conditioning circuit 138, a first adjustable load 140-1, and a second adjustable load 140-2. Hall sensor 136 may be located in gap region 114 such that hall sensor 136 measures the magnetic field in gap region 114 (as illustrated in FIG. 7). For example, hall sensor 136 may be located alongside AMR bridge sensor 108 such that both hall sensor 136 and AMR bridge sensor 108 measure the magnetic field in approximately the same location. Hall sensor 136 may generate a signal (e.g., a voltage) that indicates a strength and direction of the magnetic field in gap region 114. Hall sensor 136 may include a hall element (e.g., a silicon slab) and biasing circuitry that generates a biasing current through the hall element. A voltage may be generated across the hall element in the presence of a magnetic field, the voltage indicating the strength and direction of the magnetic field in gap region 114.

Although example modification circuits of the present disclosure include two adjustable loads connected to AMR bridge sensor 108, in some examples, only a single adjustable load may be connected to AMR bridge sensor 108. Although a hall sensor is used as the magnetic field sensor in modification circuit 134, in other examples, the hall sensor may be replaced by one of a giant MR (GMR) sensor, a tunneling MR (TMR) sensor, or an AMR sensor.

Signal conditioning circuit 138 receives the signal (e.g., voltage signal) generated by hall sensor 136. Signal conditioning circuit 138 may perform signal conditioning operations on the signal received from hall sensor 136. For example, signal conditioning circuit 138 may amplify and/or filter the signal received from hall sensor 136. Signal conditioning circuit 138 may include amplification and/or filtering circuits for performing the amplification and filtering operations. Signal conditioning circuit 138 may be configured to amplify and filter the signals received from hall sensor 136 in order to provide signals (e.g., voltage signals) to first and second adjustable loads 140-1, 140-2 such that first and second adjustable loads 140-1, 140-2 modify operation of AMR bridge sensor 108. The manner in which first and second adjustable loads 140-1, 140-2 modify operation of AMR bridge sensor 108 is described hereinafter. Although modification circuit 134 is illustrated as including signal conditioning circuit 138, in some examples, modification circuit 138 may not include signal conditioning circuit 138 and the output voltage of hall sensor 136 may be connected directly to first and second adjustable loads 140-1, 140-2.

Although signal conditioning circuit 138 is described herein as including amplification and filtering components, signal conditioning circuit 138 may generally represent any discrete and/or integrated electronic circuit components that implement analog and/or digital circuits capable of producing the functions attributed herein to signal conditioning circuit 138. For example, signal conditioning circuit 138 may include analog circuits, e.g., amplification circuits, filtering circuits, and/or other signal conditioning circuits. Signal conditioning circuit 138 may also include digital circuits, e.g., combinational or sequential logic circuits, memory devices, etc. Additionally, the functions attributed to signal conditioning circuit 138 herein may be embodied as one or more processors, microcontrollers, hardware, firmware, software, or any combination thereof.

First adjustable load 140-1 is connected in parallel with AMR element 116-1. Second adjustable load 140-2 is connected in parallel with AMR element 116-2. As described herein, two circuit elements may be referred to as "connected in parallel" when the terminals of the two circuit elements share the same nodes. Accordingly, first adjustable load 140-1 may share the same nodes as AMR element 116-1, and second adjustable load 140-2 may share the same nodes as AMR element 116-2. First and second adjustable loads 140-1, 140-2 may each represent one or more circuit components (e.g., resistors, transistors, etc.). For example, with respect to FIG. 11, first adjustable load 140-1 may include a transistor connected to AMR element 116-1. As another example, with respect to FIG. 10, first adjustable load 140-1 may include a transistor and a resistor.

Figure 9A:
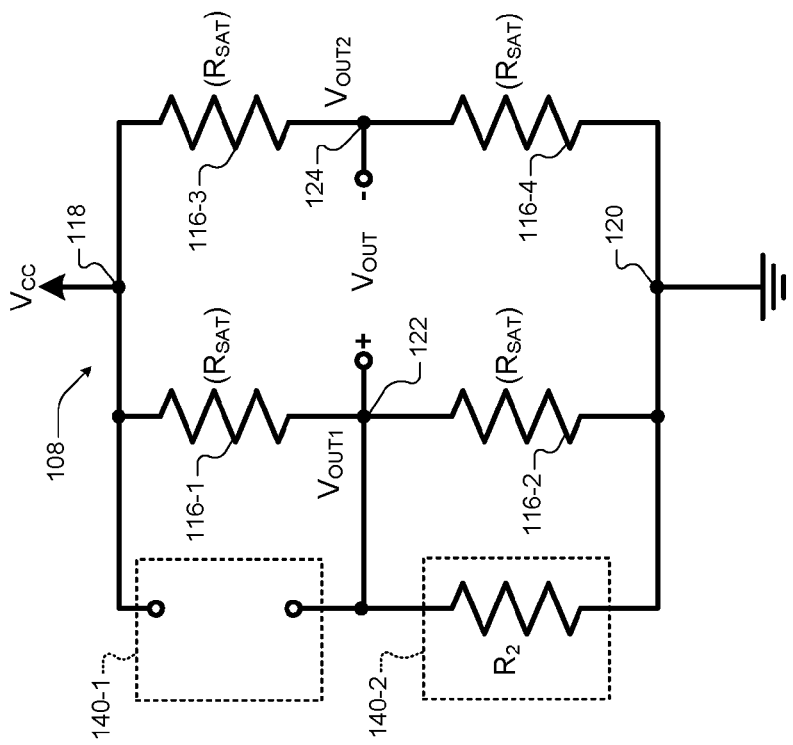
FIGS. 9A-9B are schematics that illustrate operation of the first and second adjustable loads of FIGS. 8A-8B, respectively, as resistors.
Figure 9B:
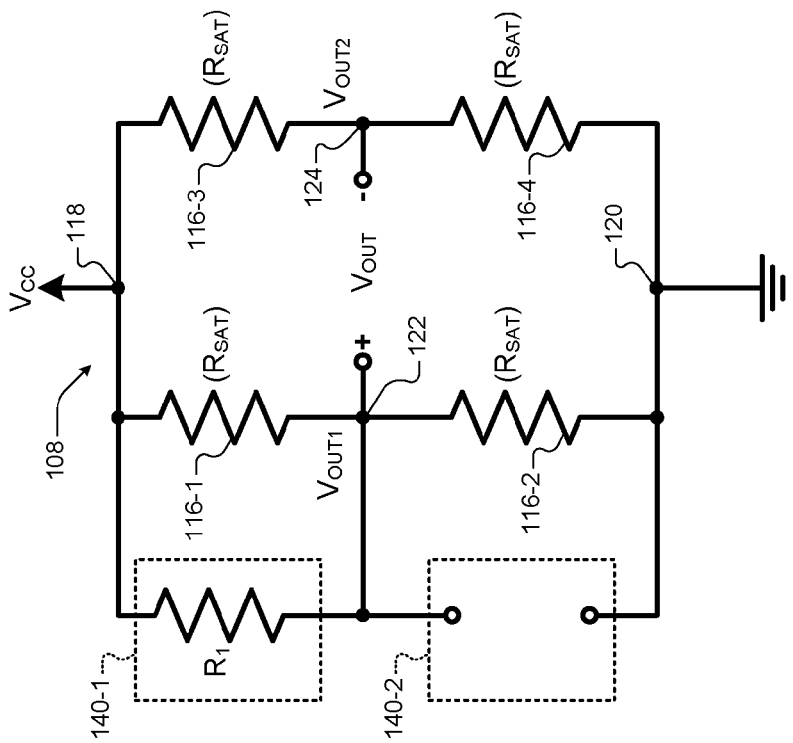

At any point during operation, first and second adjustable loads 140-1, 140-2 may behave as resistive loads, the resistive value of each load being dependent on the signals received from signal conditioning circuit 138 at that point during operation. The resistance of first and second adjustable loads 140-1, 140-2 may be controlled by the signals generated by hall sensor 136 in examples where modification circuit 134 does not include signal conditioning circuit 138. In other words, first and second adjustable loads 140-1, 140-2 may act as variable resistances which are controlled by the signals received from signal conditioning circuit 138 (or hall sensor 136 in some examples). As described herein, the resistance of first adjustable load 140-1 may refer to the resistance value (e.g., in ohms) of first adjustable load 140-1 as would be measured between the terminals of first adjustable load 140-1. Similarly, the resistance of second adjustable load 140-2 may refer to the resistance value (e.g., in ohms) of second adjustable load 140-2 as would be measured between the terminals of second adjustable load 140-2. FIGS. 9A-9B show examples of how first and second adjustable loads 140-1, 140-2 may be modeled as either open circuits or resistive loads. In the examples of FIGS. 9A-9B, first and second adjustable loads 140-1, 140-2 are modeled as either open circuits or as resistors $R_1$, $R_2$.

The resistance of first adjustable load 140-1 may take on a variety of resistive values. For example, first adjustable load 140-1 may act as an open circuit in some examples, such that the parallel combination of first adjustable load 140-1 and AMR element 116-1 is equal to, or approximately equal to, the resistance of AMR element 116-1. In other examples, first adjustable load 140-1 may take on a resistive value that causes the parallel combination of first adjustable load 140-1 and AMR element 116-1 to be less than the resistance of AMR element 116-1. An example in which first adjustable load 140-1 acts as an open circuit is illustrated in FIG. 9B. An example in which first adjustable load 140-1 acts as a resistance $R_1$ in parallel with AMR element 116-1 is illustrated in FIG. 9A.

The resistance of second adjustable load 140-2 may take on a variety of resistive values. For example, second adjustable load 140-2 may act as an open circuit in some examples, such that the parallel combination of second adjustable load 140-2 and AMR element 116-2 is equal to, or approximately equal to, the resistance of AMR element 116-2. In other examples, second adjustable load 140-2 may take on a resistive value that causes the parallel combination of second adjustable load 140-2 and AMR element 116-2 to be less than the resistance of AMR element 116-2. An example in which second adjustable load 140-2 acts as an open circuit is illustrated in FIG. 9A. An example in which second adjustable load 140-2 acts as a resistance $R_2$ in parallel with AMR element 116-2 is illustrated in FIG. 9B.

Components of modification circuit 134 may be configured such that first and second adjustable loads 140-1, 140-2 provide resistive values that cause AMR bridge sensor 108 to generate the output voltage $V'_{OUT}$, as illustrated in FIG. 6. First and second adjustable loads 140-1, 140-2 may be configured to provide relatively high resistance values (e.g., approximately equal to open circuits) when the magnetic field in gap region 114 is approximately 0 Oe, such that first and second adjustable loads 140-1, 140-2 do not affect operation of AMR bridge sensor 108. In other words, first and second adjustable loads 140-1, 140-2 may be configured such that, at approximately 0 Oe, first and second adjustable loads 140-1, 140-2 have little to no effect on output voltage $V'_{OUT}$ of AMR bridge sensor 108. For example, when the magnetic field in gap region 114 is approximately 0 Oe, the resistive values of first and second adjustable loads 140-1, 140-2 may be large relative the resistive values of AMR elements 116-1, 116-2, respectively, such that the parallel combination of first adjustable load 140-1 and AMR element 116-1 is approximately equal to R, and such that the parallel combination of second adjustable load 140-2 and AMR element 116-1 is approximately equal to R. Accordingly, at approximately 0 Oe, the voltage division of power supply voltage $V_{CC}$ across the series combination of 140-1∥116-1 and 140-2∥116-2 may be approximately equal to the voltage division of power supply voltage $V_{CC}$ across AMR element 116-1 and AMR element 116-2 when first and second adjustable loads 140-1, 140-2 are not connected to AMR bridge sensor 108.

FIG. 7 shows an example closed loop current sensing system 150 that includes modification circuit 134. As described with respect to FIG. 5, modification circuit 134 includes hall sensor 136. Hall sensor 136 may be located in gap region 114 adjacent AMR bridge sensor 108 such that hall sensor 136 and AMR bridge sensor 136 measure the magnetic field in gap region 114 in approximately the same location. Although modification circuit 134 is illustrated as located in gap region 114, it is contemplated that in some examples, only hall sensor 136 of modification circuit 136 will be included in gap region 114, while other components of modification circuit 134 are included outside of gap region 114. For example, signal conditioning circuit 138 and first and second adjustable loads 140-1, 140-2 may be located outside of gap region while hall sensor 136 is located in gap region 114.

Figure 8B:
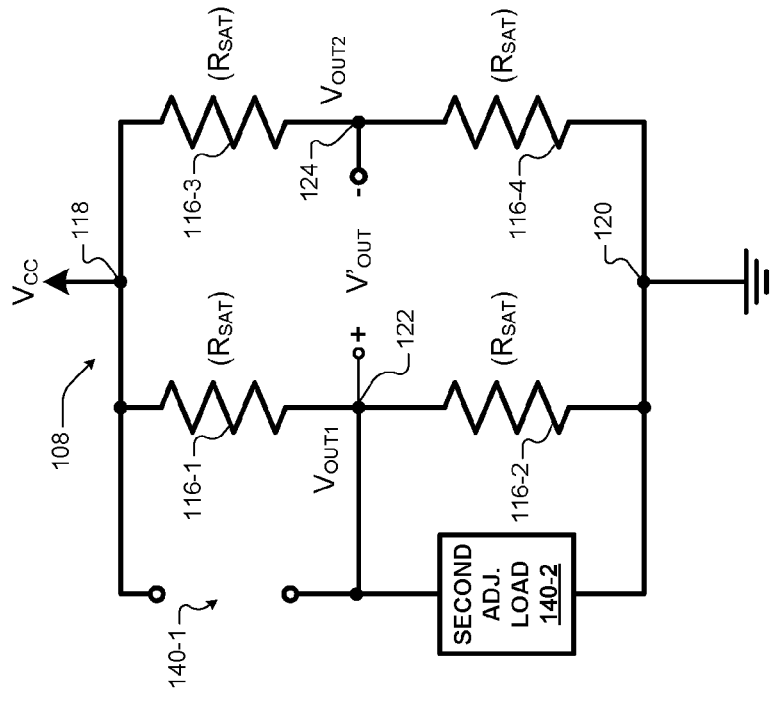
FIGS. 8A-8B are schematics that illustrate operation of first and second adjustable loads of an example modification circuit when the magnetic field in a gap region deviates from a value of zero Oersteds.
Figure 8A:
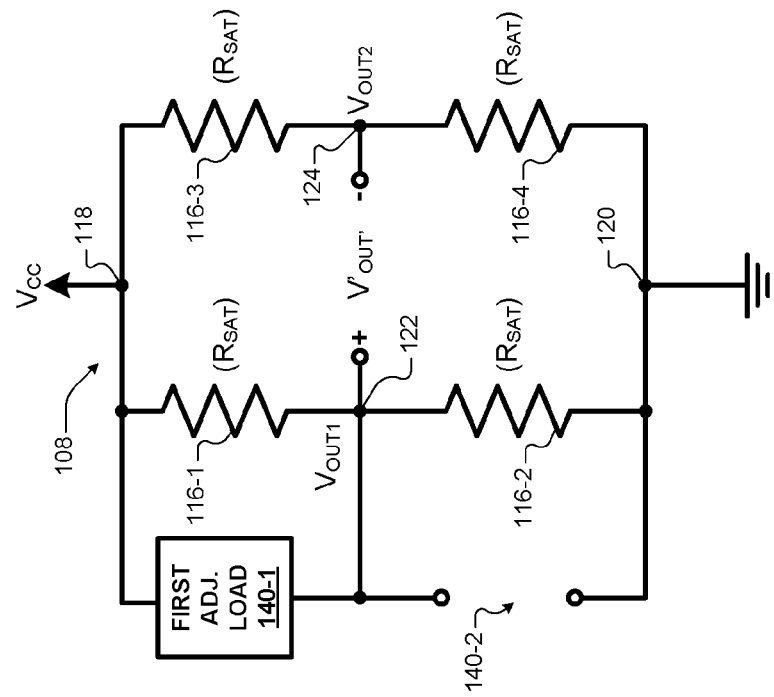

FIGS. 8A-8B illustrate operation of first and second adjustable loads 140-1, 140-2 when the magnetic field in gap region 114 deviates from approximately 0 Oe. FIG. 8A shows operation of first and second adjustable loads 140-1, 140-2 when the magnetic field in gap region 114 is in the positive direction. FIG. 8B shows operation of first and second adjustable loads 140-1, 140-2 when the magnetic field in gap region 114 is in the negative direction.

FIGS. 8A and 9A illustrate how the resistance provided by first adjustable load 140-1 in parallel with AMR element 116-1 may pull $V_{OUT1}$ towards the supply voltage $V_{CC}$. As illustrated in FIG. 8A, AMR bridge sensor 108 includes AMR elements 116 having saturated resistive values of $R_{SAT}$, indicating that the magnetic field in gap region 114 is greater than the positive threshold field. FIG. 9A shows a similar scenario, where the AMR elements 116 have saturated resistive values of $R_{SAT}$, indicating that the magnetic field in gap region 114 is greater than the positive threshold field.

FIGS. 8B and 9B illustrate how the resistance provided by second adjustable load 140-2 in parallel with AMR element 116-2 may pull $V_{OUT2}$ towards ground. As illustrated in FIG. 8B, AMR bridge sensor 108 includes AMR elements 116 having saturated resistive values of $R_{SAT}$, indicating that the magnetic field in gap region 114 has a value that is more negative than the negative threshold field. FIG. 9B shows a similar scenario, where AMR elements 116 have saturated resistive values of $R_{SAT}$, indicating that the magnetic field in gap region 114 has a value that is more negative than the negative threshold field.

With respect to FIG. 8A, first adjustable load 140-1 may modify the output voltage of AMR bridge sensor 108 when the magnetic field in gap region 114 is in the positive direction, while second adjustable load 140-2 may act as an open circuit when the magnetic field in gap region 114 is in the positive direction. Although first adjustable load 140-1 may generally modify the output voltage of AMR bridge sensor 108 for any positive magnetic field value in gap region 114, it may be assumed hereinafter that first adjustable load 140-1 is configured to modify the output voltage of AMR bridge sensor 108 for positive magnetic fields that are approximately equal to, or greater than, the positive threshold field. For example, first adjustable load 140-1 may have a relatively high resistive value that does not modify operation of AMR bridge sensor 108 when the magnetic field in gap region is between 0 Oe up to approximately the positive threshold field. However, once the magnetic field reaches a value that is approximately equal to the positive threshold field, first adjustable load 140-1 may be configured to present a resistance in parallel with AMR element 116-1, illustrated as resistance $R_1$ in FIG. 9A. This resistance provided by first adjustable load 140-1, placed in parallel with AMR element 116-1, may tend to pull the voltage $V_{OUT1}$ towards the power supply voltage $V_{CC}$.

In some examples, first adjustable load 140-1 may be configured to provide a resistance value that decreases as the strength of the magnetic field in gap region 114 increases. In this manner, first adjustable load 140-1 in parallel with AMR element 116-1 may pull $V_{OUT1}$ closer to the supply voltage as the strength of the magnetic field in gap region 114 increases. Pulling $V_{OUT1}$ closer to the supply voltage $V_{CC}$ for increasing magnetic fields may cause the output voltage $V'_{OUT}$ to monotonically increase while the magnetic field transitions from magnetic field strengths that are less than the positive threshold field to magnetic field strengths that are greater than the positive threshold field.

With respect to FIG. 8B, second adjustable load 140-2 may modify the output voltage of AMR bridge sensor 108 when the magnetic field in gap region 114 is in the negative direction, while first adjustable load 140-1 may act as an open circuit when the magnetic field in gap region 114 is in the negative direction. Although second adjustable load 140-2 may generally modify the output voltage of AMR bridge sensor 108 for any negative magnetic field value in gap region 114, it may be assumed hereinafter that second adjustable load 140-2 is configured to modify the output voltage of AMR bridge sensor 108 for negative magnetic fields that are approximately equal to, or greater in magnitude than, the negative threshold field. For example, second adjustable load 140-2 may have a relatively high resistive value that does not modify operation of AMR bridge sensor 108 when the magnetic field in gap region is between 0 Oe up to approximately the negative threshold field. However, once the magnetic field reaches a value that is approximately equal to the negative threshold field, second adjustable load 140-2 may be configured to present a resistance in parallel with AMR element 116-2, illustrated as Resistance $R_2$ in FIG. 9B. This resistance provided by second adjustable load 140-2, placed in parallel with AMR element 116-2, may tend to pull the voltage $V_{OUT2}$ towards ground.

In some examples, second adjustable load 140-2 may be configured to provide a resistance value that decreases as the strength of the magnetic field transitions from the negative threshold field towards a more negative value. In this manner, second adjustable load 140-2 in parallel with AMR element 116-2 may pull $V_{OUT2}$ closer ground as the magnetic field in gap region 114 transitions to a more negative value. Pulling $V_{OUT2}$ closer to ground as the magnetic field transitions to a more negative value may cause the output voltage $V'_{OUT}$ to monotonically transition to a more negative value while the magnetic field transitions from a magnetic field strength at approximately the negative threshold field towards a more negative value.

Figure 10:
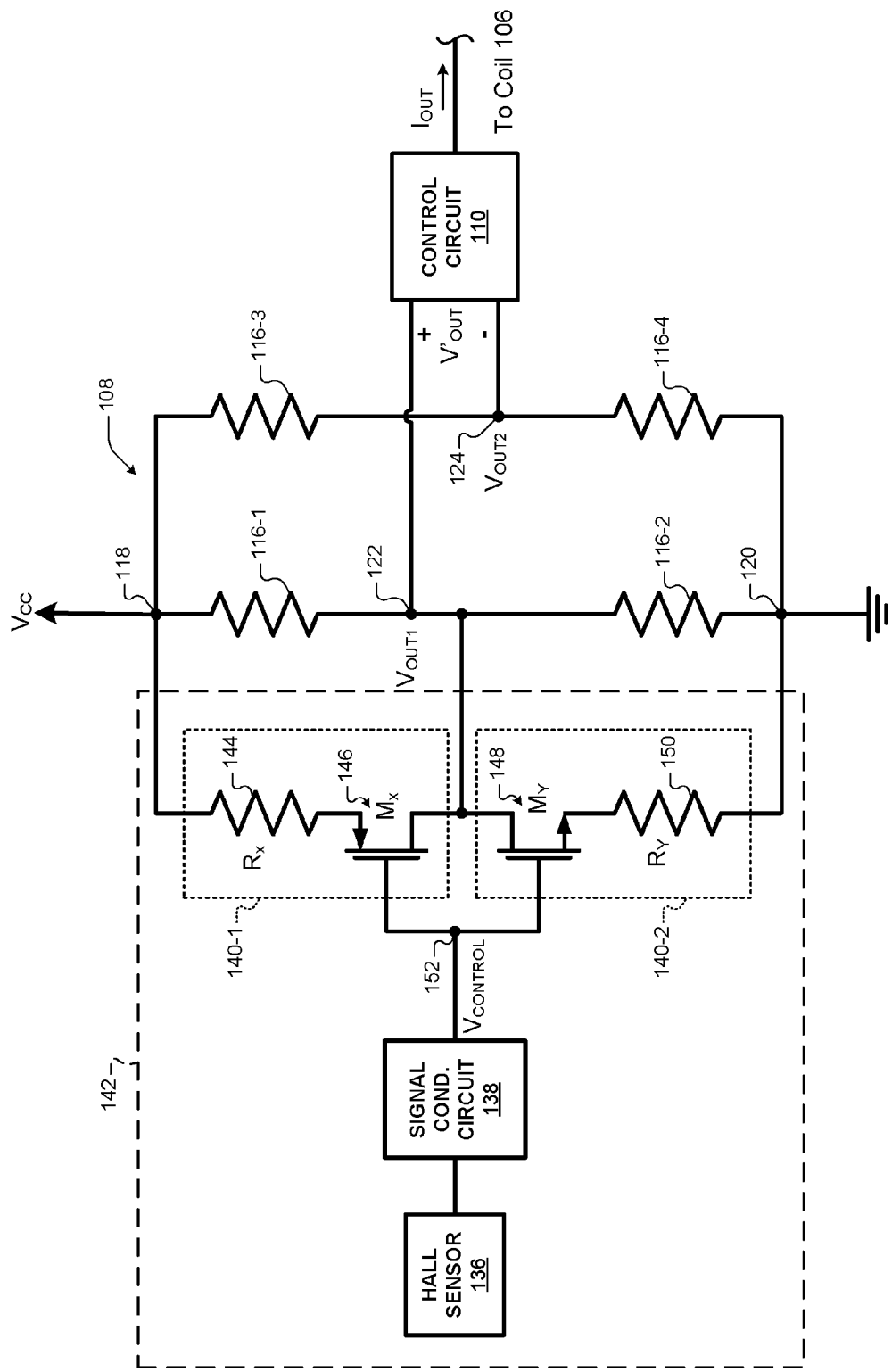
FIG. 10 is a schematic that illustrates another example modification circuit according to the present disclosure.
Figure 11:
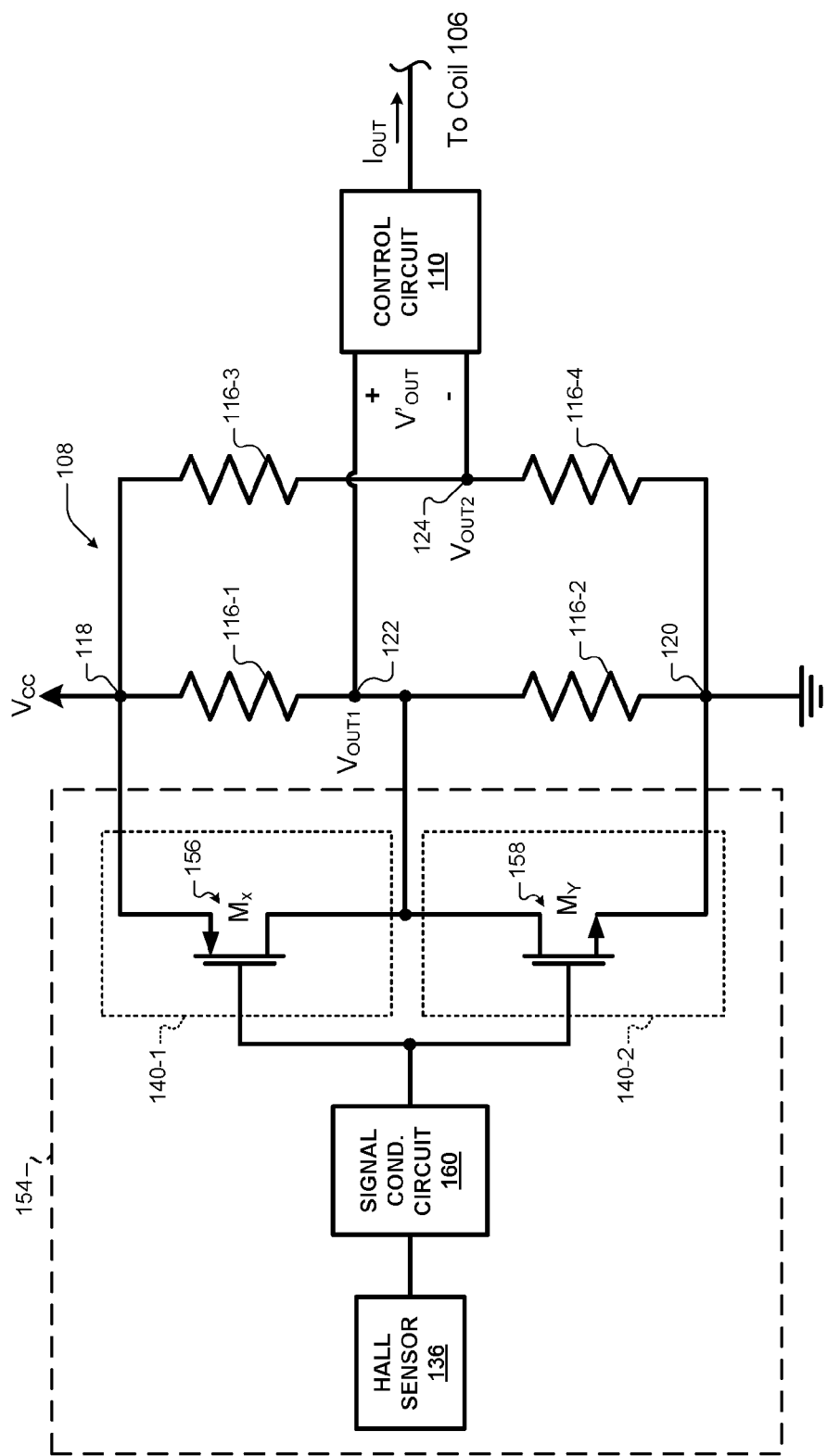
FIG. 11 is a schematic that illustrates another example modification circuit of the present disclosure.

FIG. 10 is a schematic that illustrates an example modification circuit 142 according to the present disclosure. First adjustable load 140-1 includes resistor $R_X$ 144 and transistor $M_X$ 146. Resistor $R_X$ 144 is coupled to power supply node 118 at one end and is coupled to the source of transistor $M_X$ 146 at the other end. The drain of transistor $M_X$ 146 is coupled to node 122, which is connected to second adjustable load 140-2 (the drain of transistor $M_Y$ 148 in FIG. 10). Although first and second adjustable loads 140-1, 140-2 are illustrated herein as including metal-oxide semiconductor field-effect transistors (MOSFETs), other types of transistors may be substituted in place of the MOSFET transistors in first and second adjustable loads 140-1, 140-2.

Second adjustable load 140-2 includes resistor $R_Y$ 150 and transistor $M_Y$ 148. Resistor $R_Y$ 150 is connected to ground node 120 at one end and is coupled to the source of transistor $M_Y$ 148 at the other end. The drain of transistor $M_Y$ 148 is connected to node 122, which is connected to first adjustable load 140-1 (the drain of transistor $M_X$ 146 in FIG. 10).

Signal conditioning circuit 138 generates a signal (e.g., a voltage control signal $V_{CONTROL}$) that controls the state of transistors $M_X$ 146 and $M_Y$ 148. In other words, signal conditioning circuit 138 controls the channel resistances of transistors $M_X$ 146 and $M_Y$ 148. The control signal $V_{CONTROL}$ generated at node 152 may be connected to the gates of both transistors $M_X$ 146 and $M_Y$ 148 such that the single control signal $V_{CONTROL}$ controls the state of both transistors $M_X$ 146 and $M_Y$ 148. Although first and second adjustable loads 140-1, 140-2 are illustrated and described herein as receiving the same signal, in other examples, signal conditioning circuit 138 may provide different signals to each of first and second adjustable loads 140-1, 140-2.

In some examples, signal conditioning circuit 138 may generate a control signal that causes transistor $M_X$ 146 to be in the "off" state, i.e., act as an open circuit. Similarly, signal conditioning circuit 138 may generate a control signal that causes $M_Y$ 148 to be in the "off" state. When signal conditioning circuit 138 generates a control signal that causes $M_X$ 146 or $M_Y$ 148 to operate in the off state, first and second adjustable loads 140-1, 140-2, respectively, may act as open circuits.

Signal conditioning circuit 138 may generate a control signal that turns on transistors $M_X$ 146 or $M_Y$ 148 in order to operate first or second adjustable loads 140-1, 140-2, respectively, as variable resistive loads. With respect to transistor $M_Y$ 148, signal conditioning circuit 138 may apply a voltage $V_{CONTROL}$ that is greater than the threshold voltage of transistor $M_Y$ 148 in order to turn on transistor $M_Y$ 148 and cause the combination of transistor $M_Y$ 148 and resistor $R_Y$ 150 to be placed in parallel with AMR element 116-2. Furthermore, signal conditioning circuit 138 may apply a greater value of $V_{CONTROL}$ in order to further decrease the channel resistance of transistor $M_Y$ 148, and therefore further decrease the resistance of the combination of transistor $M_Y$ 148 and resistor $R_Y$ 150 placed in parallel with AMR element 116-2. In this manner, signal conditioning circuit 138 may be configured to control the amount of resistance placed in parallel with AMR element 116-2, and therefore control the output voltage $V'_{OUT}$ of AMR bridge sensor 108 as described above. Note that a control voltage $V_{CONTROL}$ that is sufficient to turn on transistor $M_Y$ 148 and operate transistor $M_Y$ 148 in either the linear or saturated state may be a control voltage that causes transistor $M_X$ 146 to operate in the off state. Accordingly, while signal conditioning circuit 138 applies a control voltage that is sufficient to turn on transistor $M_Y$ 148 and cause second adjustable load 140-2 to act as a resistance in parallel with AMR element 116-2, that same control voltage may cause transistor $M_X$ 146 to operate in the off state, which causes first adjustable load 140-1 to operate as an open circuit.

With respect to transistor $M_X$ 146, signal conditioning circuit 138 may apply a sufficient control voltage to the gate of transistor $M_X$ 146 in order to turn on transistor $M_X$ 146 and cause the combination of transistor $M_X$ 146 and resistor $R_X$ 144 to be placed in parallel with AMR element 116-1. Furthermore, signal conditioning circuit 138 may apply a control voltage (e.g., further from $V_{CC}$) to the gate of transistor $M_X$ 146 in order to further decrease the channel resistance of transistor $M_X$ 146, and therefore further decrease the resistance of the combination of transistor $M_X$ 146 and resistor $R_X$ 144 placed in parallel with AMR element 116-1. In this manner, signal conditioning circuit 138 may be configured to control the amount of resistance placed in parallel with AMR element 116-1, and therefore control the output voltage $V'_{OUT}$ of AMR bridge sensor 108 as described above. Note that a control voltage that is sufficient to turn on transistor $M_X$ 146 and operate transistor $M_X$ 146 in either the linear or saturated state may be a control voltage that causes transistor $M_Y$ 148 to operate in the off state. Accordingly, while signal conditioning circuit 138 applies a control voltage that is sufficient to turn on transistor $M_X$ 146 and cause second adjustable load 140-1 to act as a resistance in parallel with AMR element 116-1, that same control voltage may cause transistor $M_Y$ 148 to operate in the off state, which causes second adjustable load 140-2 to operate as an open circuit.

In summary, modification circuit 142 may be configured to measure the magnetic field in gap region 114 and modify the voltage output of AMR bridge sensor 108 to achieve the monotonic output voltage illustrated in FIG. 6. For example, when hall sensor 136 indicates that the strength of the magnetic field in gap region 114 is greater than the positive threshold field, signal conditioning circuit 138 may generate a control signal that turns on transistor $M_X$ 146 and that controls the channel resistance of transistor $M_X$ 146 in order to achieve modification of the output voltage $V'_{OUT}$ as described herein, which is illustrated in FIG. 6. As an additional example, when hall sensor 136 indicates that the strength of the magnetic field in gap region 114 is more negative than the negative threshold field, signal conditioning circuit 138 may generate a control signal that turns on transistor $M_Y$ 148 and that controls the channel resistance of transistor $M_Y$ 148 in order to achieve modification of the output voltage $V'_{OUT}$ as described herein, which is illustrated in FIG. 6.

In examples where modification circuit 134 does not include signal conditioning circuit 138, hall sensor 136 may generate the control voltage $V_{CONTROL}$ described herein. For example, hall sensor 136 may be configured to generate a control voltage that turns on transistor $M_X$ 146 and controls the channel resistance of transistor $M_X$ 146 when the magnetic field in gap region 114 is greater than the positive threshold field. As another example, hall sensor 136 may be configured to generate a control voltage that turns on transistor $M_Y$ 148 and controls the channel resistance of transistor $M_Y$ 148 when the magnetic field in gap region 114 is more negative than the negative threshold field.

It is contemplated that the components included in modification circuit 142 and/or AMR bridge sensor 108 may be selected to have various characteristics based on various design considerations. For example, for a given AMR bridge sensor, the components of modification circuit 142 may be selected based on the resistances of AMR elements of the given AMR bridge sensor. The components of modification circuit 142 may also be selected based on a desired output voltage waveform $V'_{OUT}$ that is to be obtained when modification circuit 142 is connected to a given AMR bridge sensor. The parameters of modification circuit 142 may be selected based on some or all of the following design considerations: the values of resistor $R_X$ 144 and resistor $R_Y$ 150, the operating characteristics of transistors $M_X$ 146 and $M_Y$ 148 (e.g., threshold voltage, channel resistance, etc.), the sensitivity of hall sensor 136 to magnetic fields, and the amplification and filtering characteristics of signal conditioning circuit 138.

It is also contemplated that first and second adjustable loads 140-1, 140-2 may comprise various different types of circuits other than the transistor and resistor combinations illustrated in FIG. 10. For example, with respect to FIG. 11, example modification circuit 154 includes first and second adjustable loads 140-1, 140-2 that do not include resistors $R_X$ 144 and $R_Y$ 150, but instead include transistors $M_X$ 156 and $M_Y$ 158. In this example, transistors $M_X$ 156 and $M_Y$ 158 may be controlled sufficiently by signal conditioning circuit 160 in order to achieve the output voltage $V'_{OUT}$ as illustrated in FIG. 6. In other words, transistors $M_X$ 156 and $M_Y$ 158 may have operating characteristics (e.g., turn on voltages, channel resistances, etc.) that may be sufficiently controlled by signal conditioning circuit 160 in order to achieve the $V'_{OUT}$ as illustrated in FIG. 6.

Figure 12:
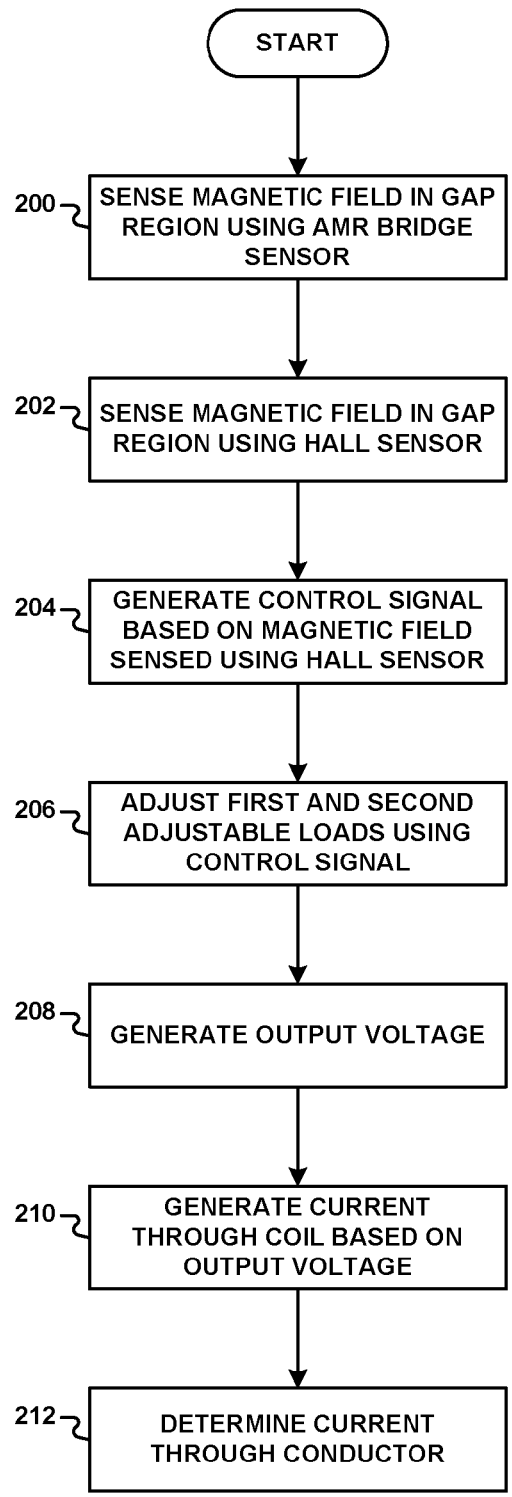
FIG. 12 is a flow chart that illustrates an example method for modifying operation of the AMR bridge circuit of FIG. 2.

FIG. 12 is a flow chart that illustrates a method for modifying operation of an AMR bridge circuit according to the present disclosure. The method of FIG. 12 may describe operation of current sensing system 150. Initially, AMR bridge sensor 108 may sense the strength and direction of the magnetic field in gap region 114 (200). Additionally, hall sensor 136 may also sense the magnitude and direction of the magnetic field in gap region 114 (202). Signal conditioning circuit 138 may generate control voltage $V_{CONTROL}$ at node 152 based on the signals generated by hall sensor 136 (204). Control voltage $V_{CONTROL}$, generated by signal conditioning circuit 138, may adjust the resistances of first and second adjustable loads 140-1, 140-2 (206). In some examples, control voltage $V_{CONTROL}$ may be applied to gates of transistors included in first and second adjustable loads 140-1, 140-2 in order to control the resistance of first and second adjustable loads 140-1, 140-2. AMR bridge sensor 108, the operation of which may be modified by the resistances of first and second adjustable loads 140-1, 140-2, may then generate an output voltage $V'_{OUT}$ (208). Control circuit 110 may generate an output current $I_{OUT}$ through coil 106 based on output voltage $V'_{OUT}$ in order to drive the magnetic field in gap region 114 to 0 Oe (e.g., in order to attempt to drive $V'_{OUT}$ to zero volts) (210). Upon driving the magnetic field in gap region 114 to 0 Oe, the voltage measurement circuit (not shown) may measure the voltage $V_{SENSE}$ across sense resistor 112 and determine the amount of current through conductor 102 based on $V_{SENSE}$.

Although a few examples have been described in detail above, other examples and modifications are within the scope of this disclosure. For example, the flow diagram depicted in the figures does not require the particular order shown, or sequential order, to achieve desirable results. Other steps may be provided, or steps may be eliminated, from the described flow diagram, and other components may be added to, or removed from, the described systems. Other embodiments may be within the scope of the following claims.

The invention claimed is:

1. A system comprising: a magnetoresistive (MR) bridge circuit configured to receive a supply voltage between a supply node and a ground node, and configured to generate an output voltage that indicates a strength and direction of a magnetic field, the MR bridge circuit comprising:
    first and second MR elements connected in series between the supply node and the ground node; and
    third and fourth MR elements connected in series between the supply node and the ground node, wherein the output voltage is generated between a first node that is common to the first and second MR elements and a second node that is common to the third and fourth MR elements;
    a magnetic field sensor configured to generate signals based on the strength and direction of the magnetic field; and
    a first adjustable load connected in parallel with one of the MR elements, wherein the first adjustable load has a first resistance that is controlled based on the signals generated by the magnetic field sensor.

2. The system of claim 1, further comprising:
    a core material defining a gap region;
    a conductor arranged adjacent to the core material; and
    a coil wrapped around a portion of the core material, wherein the magnetic field is generated in the gap region, wherein the magnetic field comprises a first component and a second component, and wherein the first and second components are generated by current through the conductor and current through the coil, respectively.

3. The system of claim 2, wherein the MR bridge circuit and the magnetic field sensor are located in the gap region.

4. The system of claim 2, further comprising a control circuit configured to:
    receive the output voltage that indicates the strength and direction of the magnetic field; and
    generate current through the coil that has a magnitude and direction that drives the magnetic field in the gap region towards zero.

5. The system of claim 4, further comprising a measurement circuit that is configured to determine an amount of current through the conductor based on the amount of current generated by the control circuit through the coil.

6. The system of claim 1, wherein the MR elements comprise anisotropic MR elements.

7. The system of claim 1, wherein the magnetic field sensor comprises one of a hall effect sensor, a giant magnetoresistive (GMR) sensor, a tunneling magnetoresistive sensor (TMR), or an anisotropic magnetoresistive (AMR) sensor.

8. The system of claim 1, further comprising a signal conditioning circuit configured to:
    receive the signals generated by the magnetic field sensor;
    perform signal conditioning operations on the signals received by the magnetic field sensor to generate a control signal; and
    adjust the first resistance of the first adjustable load using the control signal.

9. The system of claim 1, wherein the first adjustable load comprises a transistor, and wherein the transistor provides the first resistance that is controlled based on the signals generated by the magnetic field.

10. The system of claim 1, wherein the first adjustable load comprises a transistor and a resistor.

11. The system of claim 10, wherein a state of the transistor is controlled based on the signals generated by the magnetic field sensor, wherein a channel of the transistor is connected in series with the resistor, wherein the series connection of the channel and the resistor provides the first resistance that is controlled based on the signals generated by the magnetic field sensor, and wherein the series connection of the channel and the resistor is connected in parallel with the one of the MR elements.

12. The system of claim 1, further comprising a second adjustable load having a second resistance that is controlled based on the signals generated by the magnetic field sensor, wherein the first adjustable load is connected in parallel with the first MR element, and wherein the second adjustable load is connected in parallel with the second MR element.

13. The system of claim 12, wherein the first resistance is approximately an open circuit when the magnetic field is in a first direction, wherein the second resistance varies based on the strength of the magnetic field when the magnetic field is in the first direction, wherein the second resistance acts as an open circuit when the magnetic field is in a second direction that is opposite to the first direction, and wherein the first resistance varies based on the strength of the magnetic field when the magnetic field is in the second direction.

14. The system of claim 12, wherein the first and second resistances are configured to cause the output voltage to monotonically increase in magnitude as the magnetic field transitions from zero towards a larger magnitude in a first direction, and wherein the first and second resistances are configured to cause the output voltage to monotonically increase in magnitude as the magnetic field transitions from zero towards a larger magnitude in a second direction that is opposite to the first direction.

15. The system of claim 1, wherein the first, second, third, and fourth MR elements each trend towards the same resistive value when the magnetic field transitions to a value that is greater than a threshold magnetic field strength.

16. A system comprising:
a magnetoresistive (MR) bridge circuit configured to generate an output voltage that indicates a strength and direction of a magnetic field, the MR bridge circuit comprising:
first and second MR elements connected in series between the supply node and the ground node; and
third and fourth MR elements connected in series between the supply node and the ground node, wherein the output voltage is generated between a first node that is common to the first and second MR elements and a second node that is common to the third and fourth MR elements;
a magnetic field sensor configured to generate signals based on the strength and direction of the magnetic field;
a first adjustable load connected in parallel to one of the MR elements of the MR bridge circuit, wherein the first adjustable load has a first resistance that is controlled based on the signals generated by the magnetic field sensor; and
a second adjustable load connected in parallel to one of the MR elements the MR bridge circuit, wherein the second adjustable load has a second resistance that is controlled based on the signals generated by the magnetic field sensor, and wherein the output voltage generated by the MR bridge circuit is dependent on the values of the first and second resistances.

17. The system of claim 16, wherein the first adjustable load includes a first transistor, wherein the first resistance includes a channel resistance of the first transistor, and wherein the operating state of the transistor is controlled based on the signals generated by the magnetic field sensor.

18. The system of claim 16, wherein the first and second resistances are configured to cause the output voltage to monotonically increase in magnitude as the magnetic field transitions from zero towards a larger magnitude in a first direction, and wherein the first and second resistances are configured to cause the output voltage to monotonically increase in magnitude as the magnetic field transitions from zero towards a larger magnitude in a second direction that is opposite to the first direction.

19. A method comprising:
generating an output voltage that indicates a strength and direction of a magnetic field using a magnetoresistive (MR) bridge circuit, the MR bridge circuit comprising:
first and second MR elements connected in series between the supply node and the ground node; and
third and fourth MR elements connected in series between the supply node and the ground node, wherein the output voltage is generated between a first node that is common to the first and second MR elements and a second node that is common to the third and fourth MR elements;
generating signals based on the strength and direction of the magnetic field using a magnetic field sensor;
controlling a first resistance included in a first adjustable load based on the signals generated by the magnetic field sensor, wherein the first adjustable load is connected in parallel to one of the MR elements of the MR bridge circuit; and
controlling a second resistance included in a second adjustable load based on the signals generated by the magnetic field sensor, wherein the second adjustable load is connected in parallel to one of the MR elements of the MR bridge circuit, and wherein the output voltage is generated based on the values of the first and second resistances.

20. The method of claim 19, wherein controlling the first resistance comprises controlling an operating state of a first transistor included in the first adjustable load, wherein controlling the second resistance comprises controlling an operating state of a second transistor included in the second adjustable load, wherein the first resistance includes a channel resistance of the first transistor, and wherein the second resistance includes a channel resistance of the second transistor.

* * * * *